United States Patent
Birkmeyer et al.

(10) Patent No.: US 7,622,048 B2
(45) Date of Patent: Nov. 24, 2009

(54) SACRIFICIAL SUBSTRATE FOR ETCHING

(75) Inventors: Jeffrey Birkmeyer, San Jose, CA (US); Stephen R. Deming, San Jose, CA (US); Zhenfang Chen, Cupertino, CA (US)

(73) Assignee: Fujifilm Dimatix, Inc., Lebanon, NH (US)

( * ) Notice: Subject to any disclaimer, the term of this patent is extended or adjusted under 35 U.S.C. 154(b) by 458 days.

(21) Appl. No.: 11/256,669

(22) Filed: Oct. 21, 2005

(65) Prior Publication Data

US 2008/0020573 A1  Jan. 24, 2008

Related U.S. Application Data

(60) Provisional application No. 60/621,507, filed on Oct. 21, 2004.

(51) Int. Cl.
*B24C 1/22* (2006.01)
(52) U.S. Cl. ............... 216/34; 216/20; 216/59; 216/67
(58) Field of Classification Search ............ 216/59, 216/67, 79, 20, 34; 438/706, 719
See application file for complete search history.

(56) References Cited

U.S. PATENT DOCUMENTS

| | | | |
|---|---|---|---|
| 6,326,285 B1 * | 12/2001 | Behfar et al. | 438/455 |
| 6,393,685 B1 * | 5/2002 | Collins | 29/416 |
| 6,808,956 B2 * | 10/2004 | Cabuz et al. | 438/52 |
| 7,393,713 B2 * | 7/2008 | Kim et al. | 438/52 |
| 2002/0171080 A1 | 11/2002 | Faris | |
| 2003/0116815 A1 | 6/2003 | Dewa | |
| 2003/0211705 A1 * | 11/2003 | Tong et al. | 438/455 |
| 2005/0009297 A1 * | 1/2005 | Rayssac et al. | 438/455 |
| 2005/0186758 A1 * | 8/2005 | Henley et al. | 438/458 |

FOREIGN PATENT DOCUMENTS

| | | |
|---|---|---|
| DE | 199 58 803 C1 | 8/2001 |
| WO | WO 03/059591 A | 7/2003 |

OTHER PUBLICATIONS

J. Bagdahn et al., "A new approach for handling and transferring of thin semiconductor materials", Jan. 2003, Microsystem Technologies, Berlin, Germany, vol. 9, No. 3, pp. 204-209.
International Search Report and Written Opinion of the International Searching Authority, International Application Serial No. PCT/US2005/038007, Feb. 23, 2006, 9 pages.
Communication pursuant to Article 94(3) EPC, Jul. 1, 2009, European Patent Office (office action issued in corresponding European application No. 05851235.1).

\* cited by examiner

*Primary Examiner*—Lan Vinh
(74) *Attorney, Agent, or Firm*—Fish & Richardson P.C.

(57) ABSTRACT

A method of etching a silicon substrate is described. The method includes bonding a first silicon substrate to a sacrificial silicon substrate. The first silicon substrate is etched. A pressure is applied at an interface of the first silicon substrate and the sacrificial silicon substrate to cause the first silicon substrate to separate from the sacrificial silicon substrate. An apparatus having metal blades can be used to separate the substrates.

19 Claims, 23 Drawing Sheets

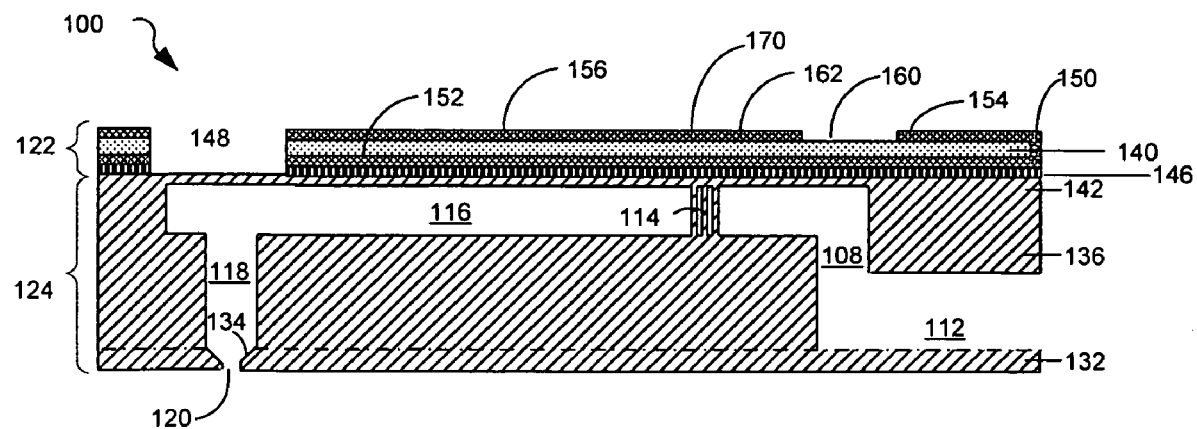
FIG._1
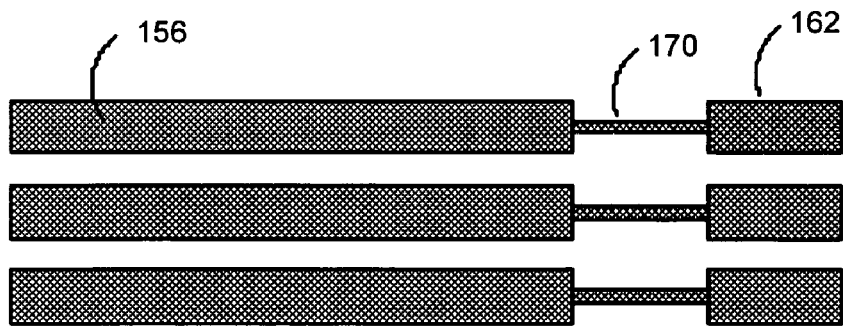
FIG._2

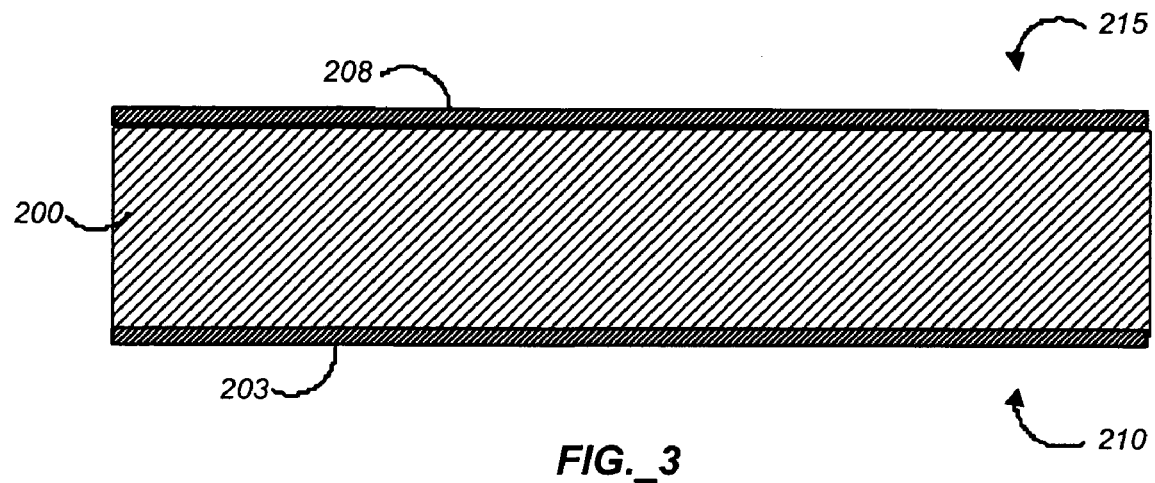
FIG._3
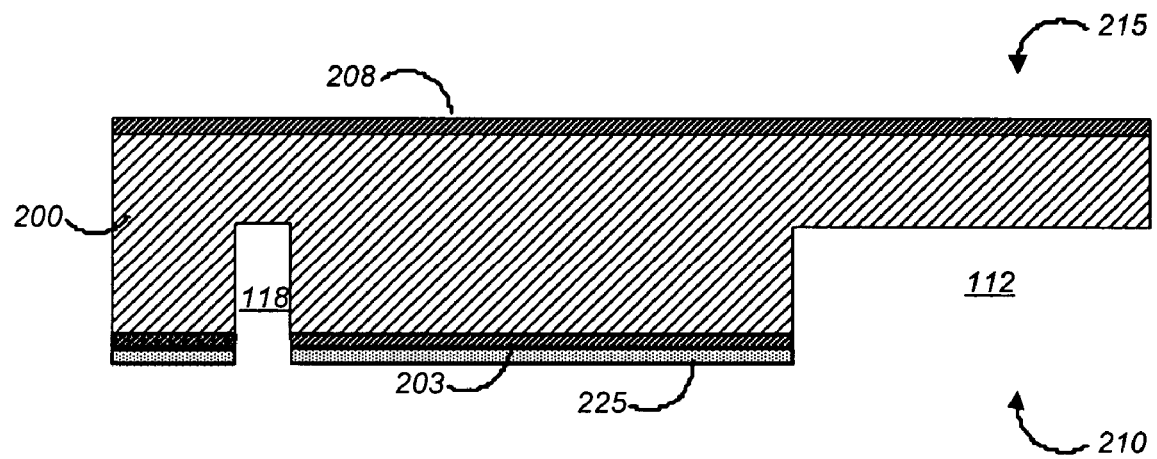
FIG._4

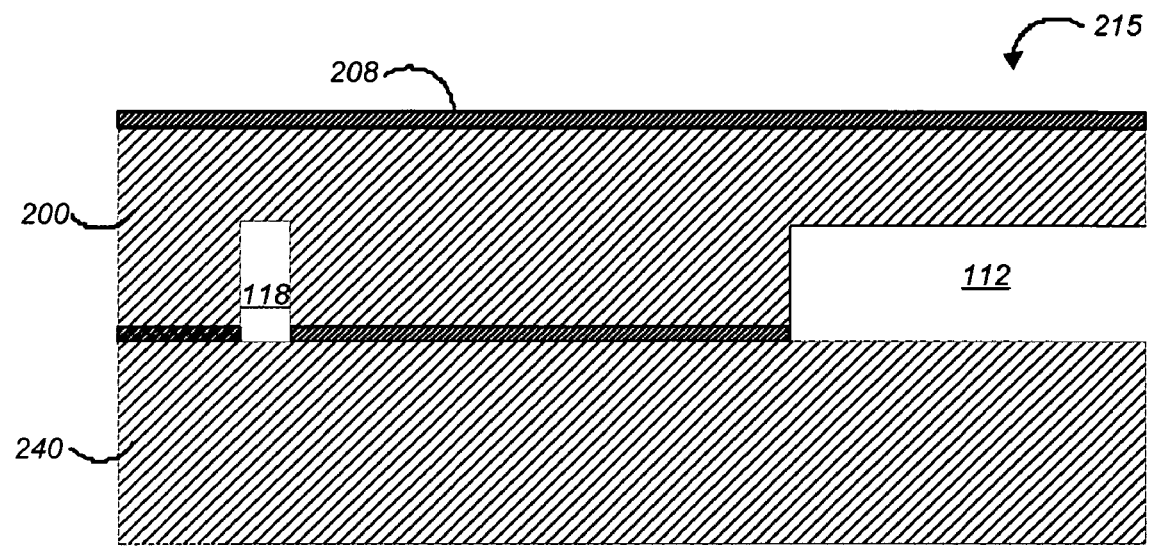
FIG._5
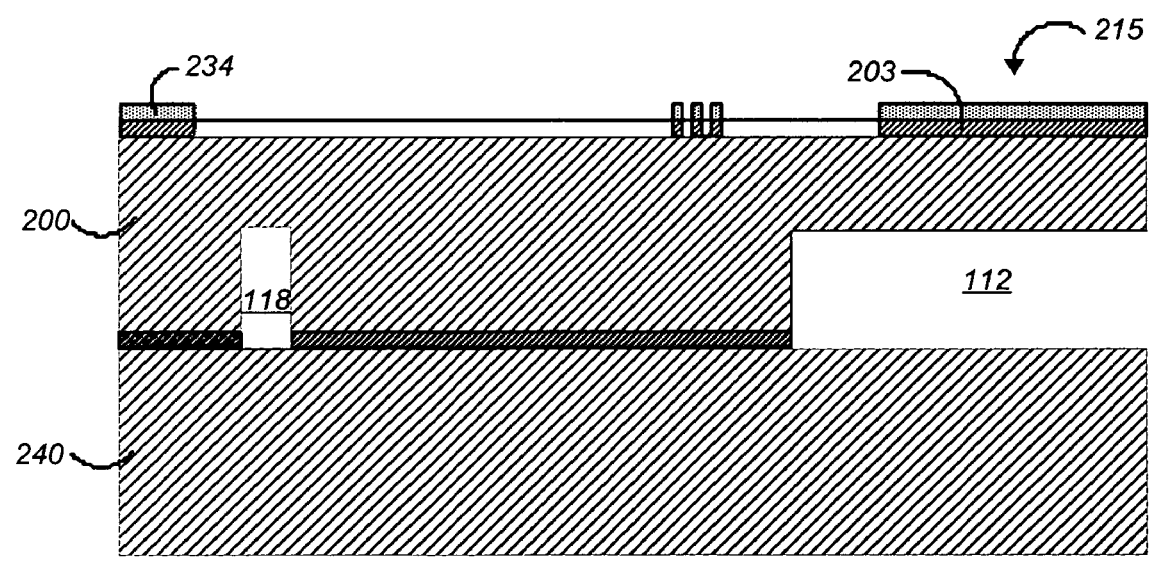
FIG._6

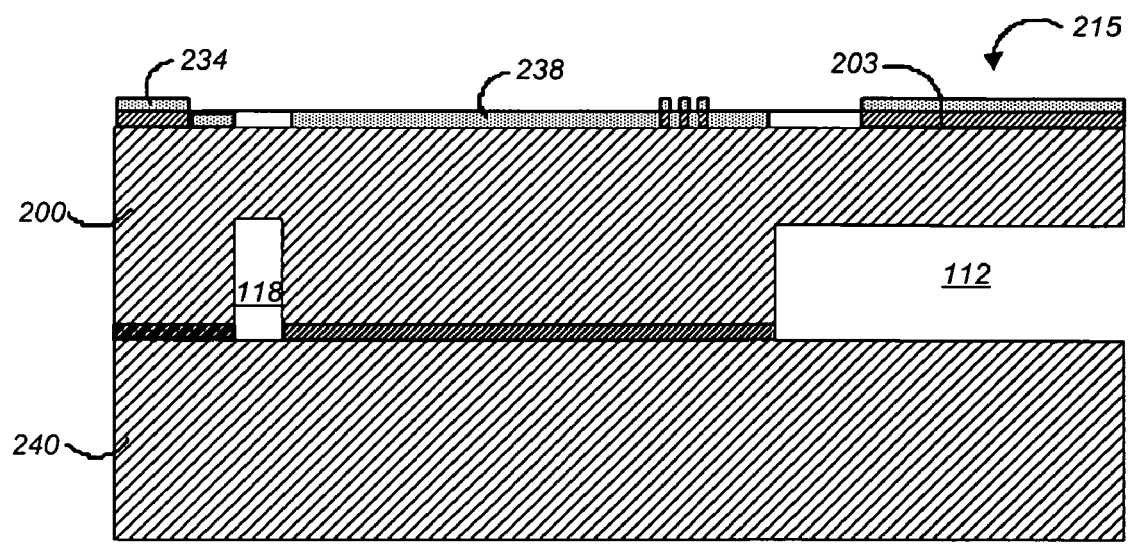
*FIG._7*
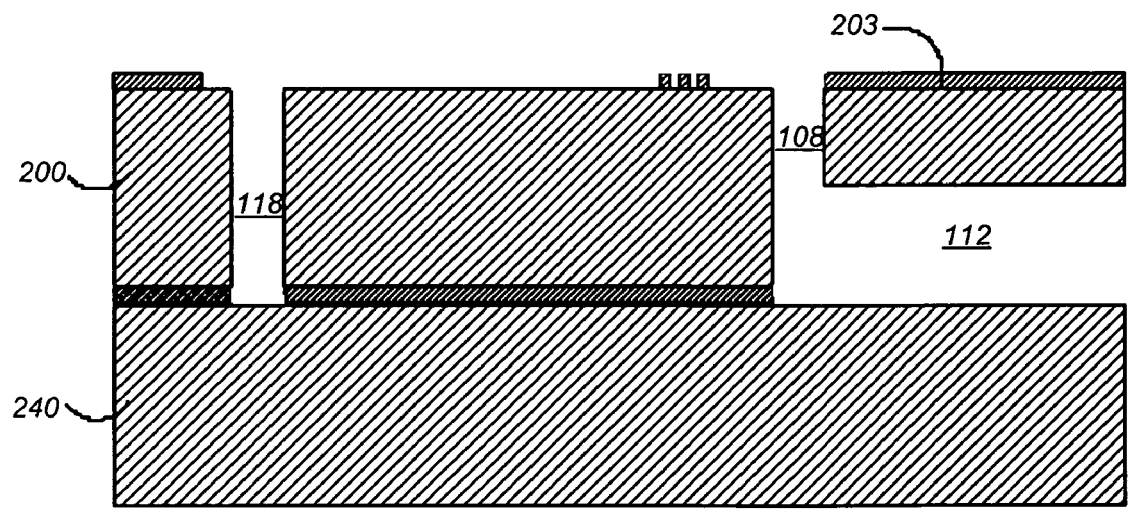
*FIG._8*

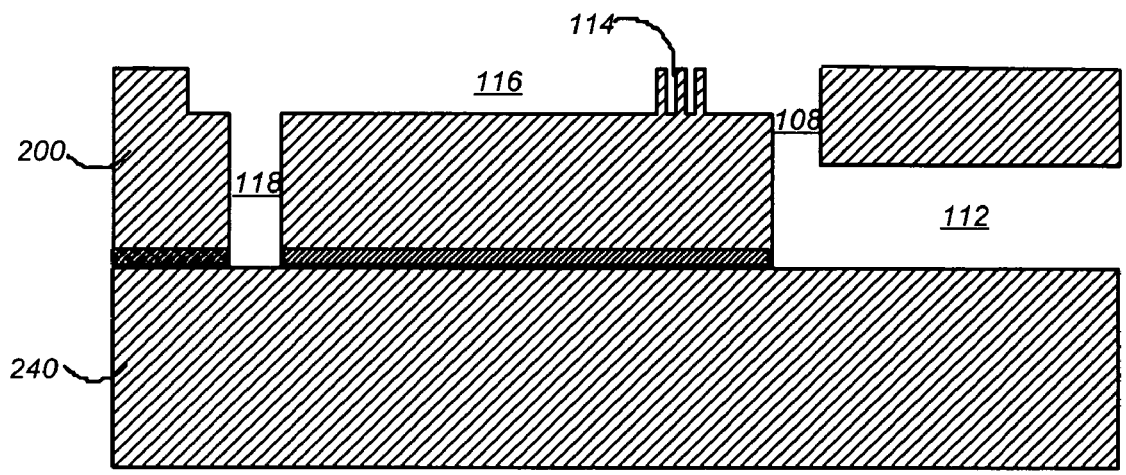
FIG._9
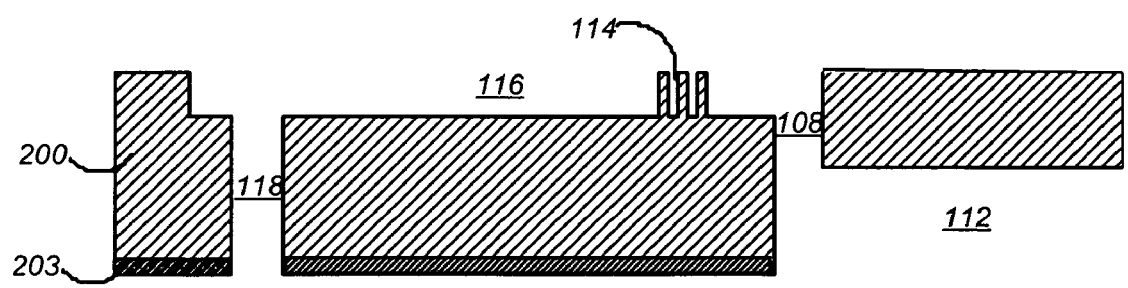
FIG._10
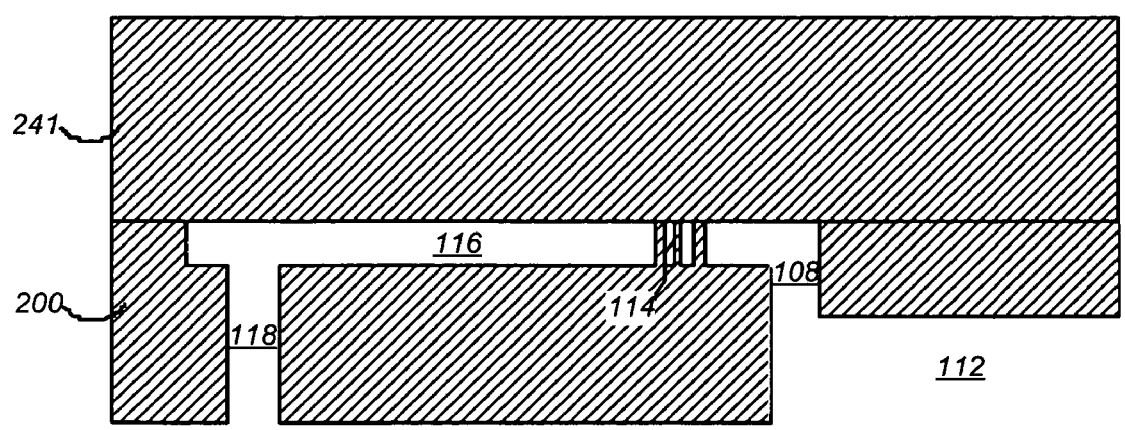
FIG._13

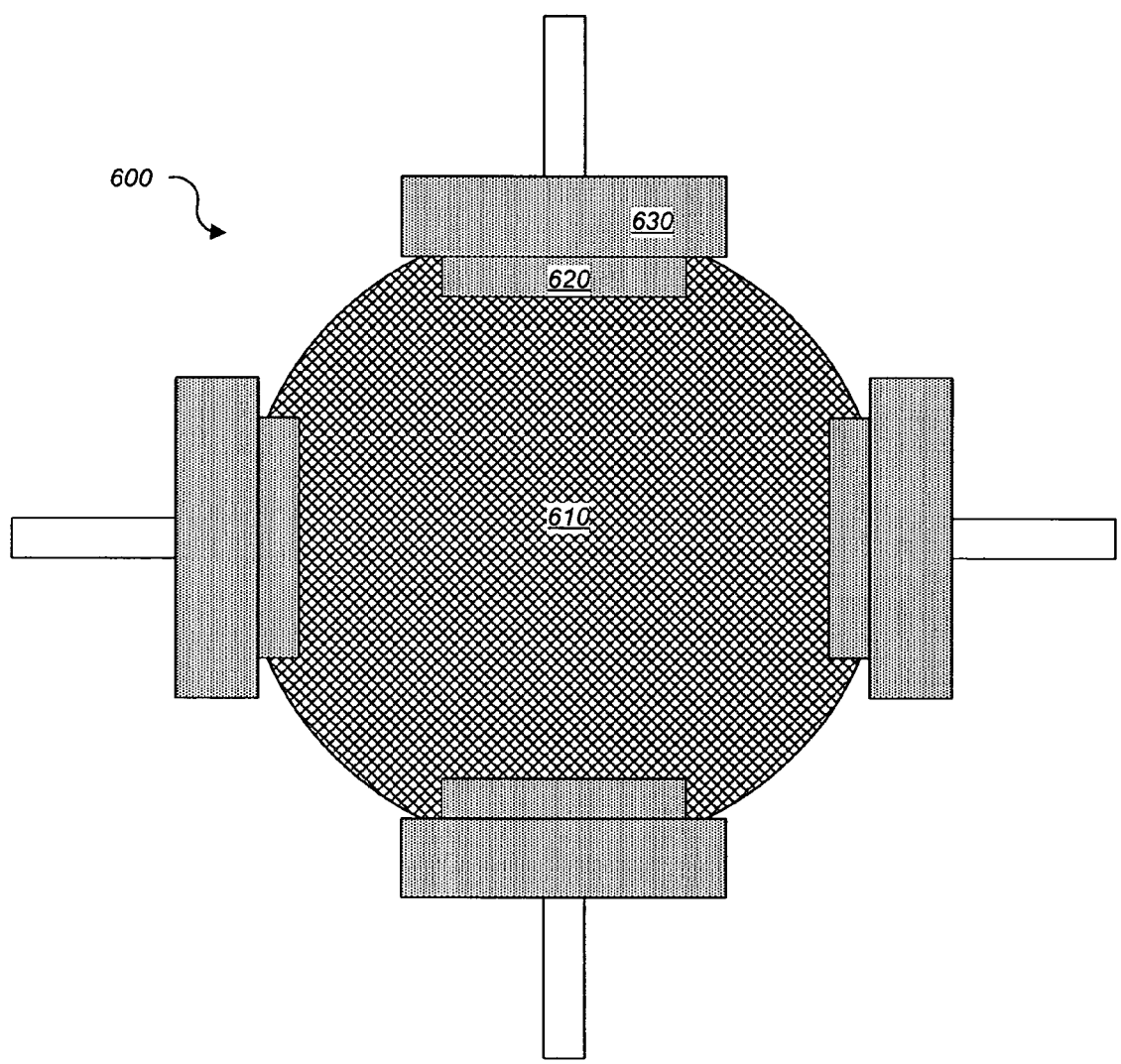
FIG._11
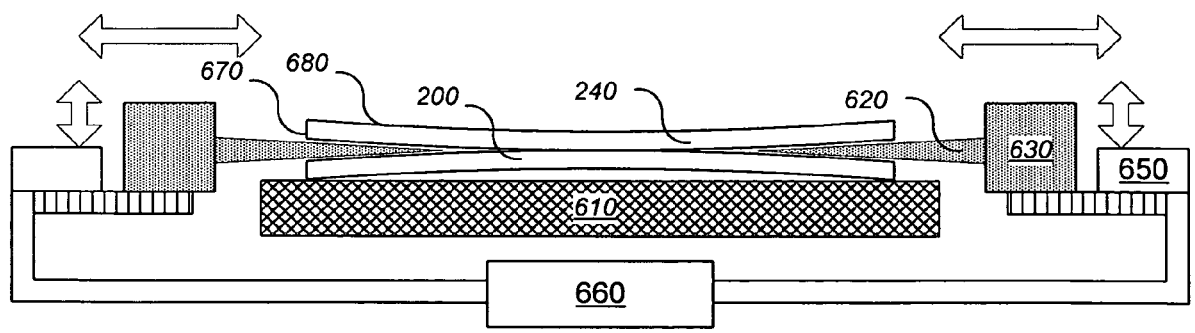
FIG._12

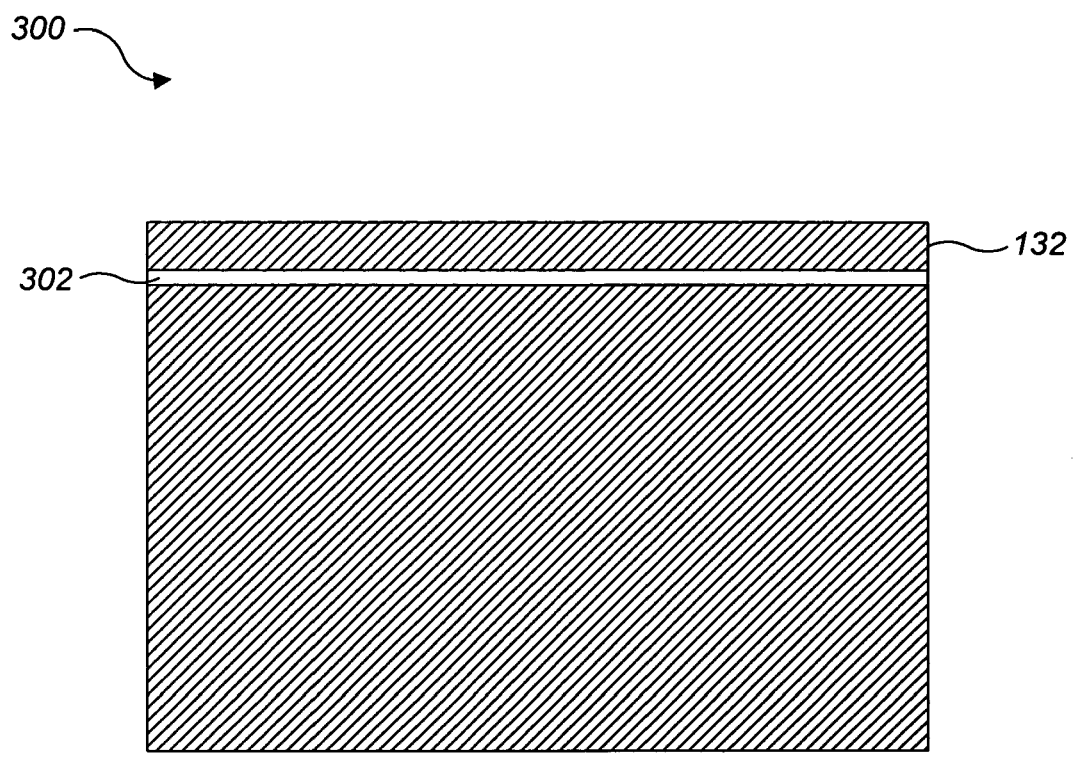
FIG._14
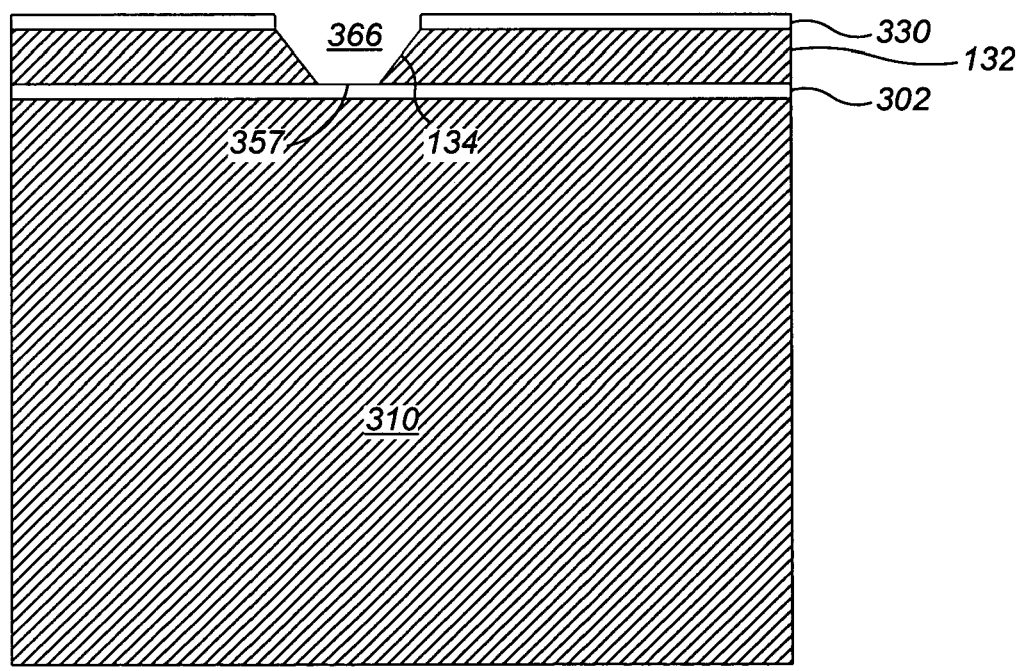
FIG._15

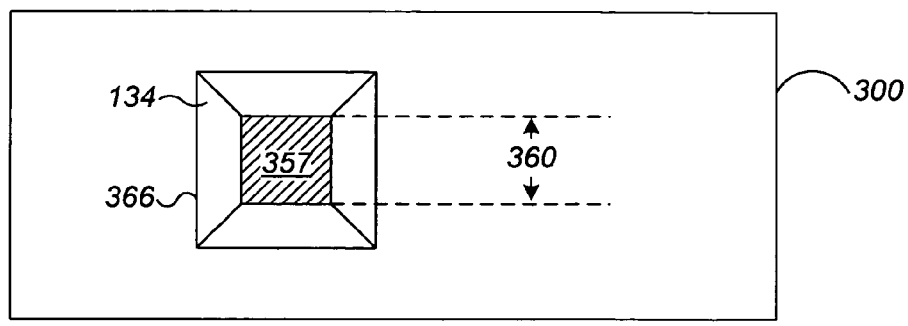
FIG._16
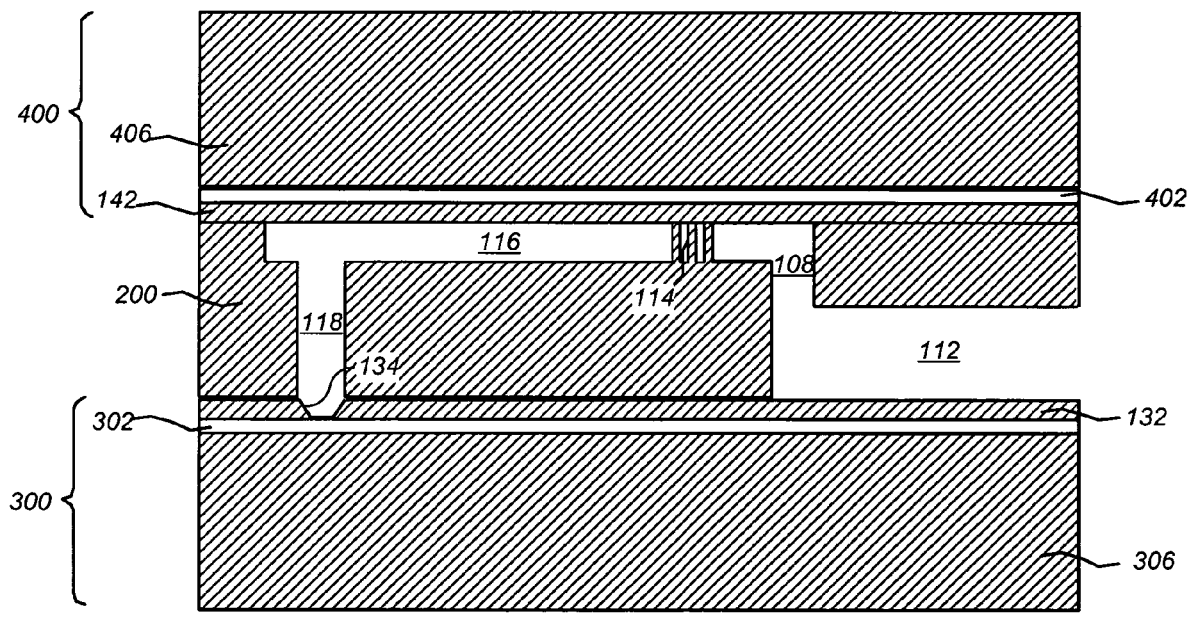
FIG._17
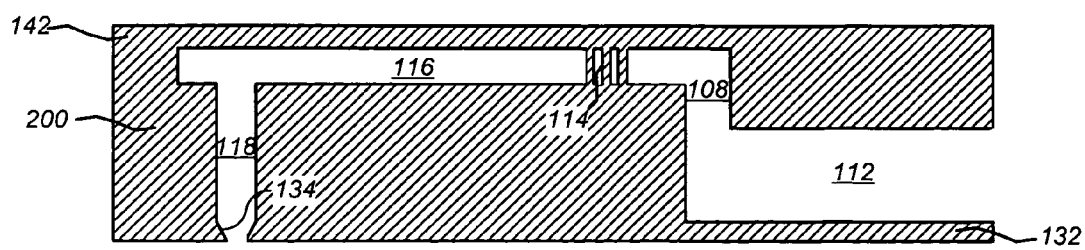
FIG._18

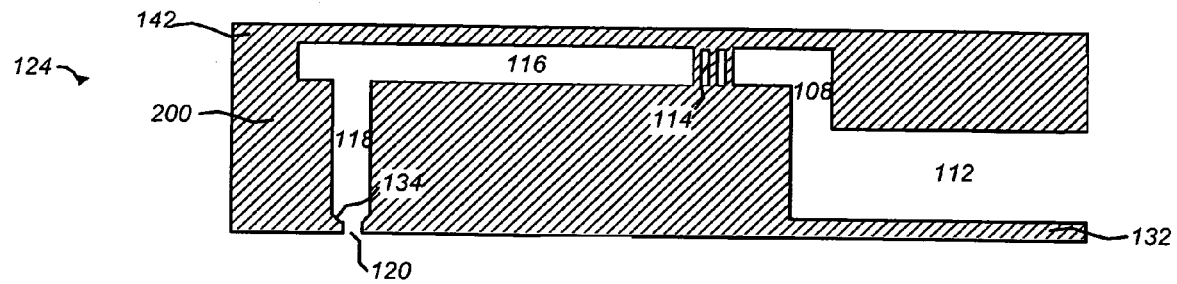
FIG._19
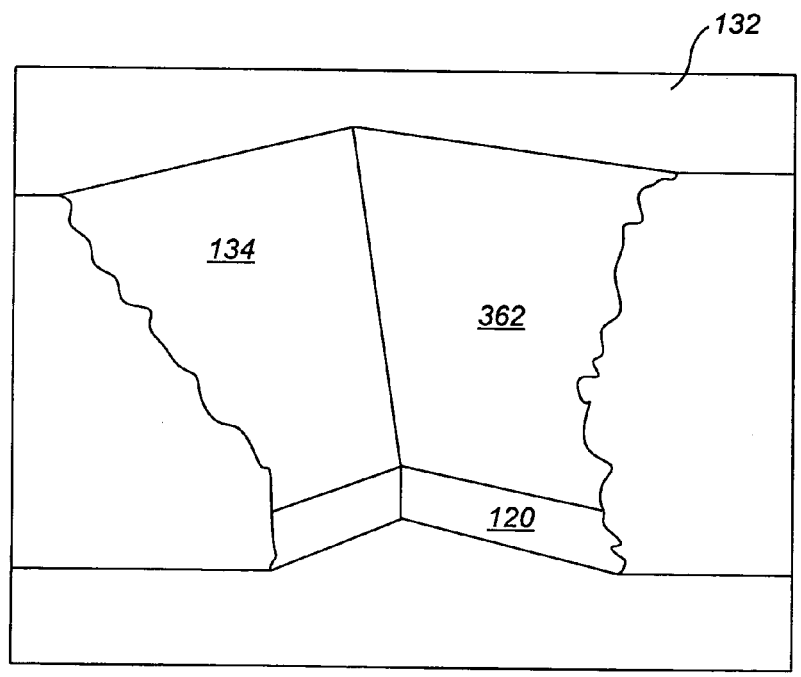
FIG._20

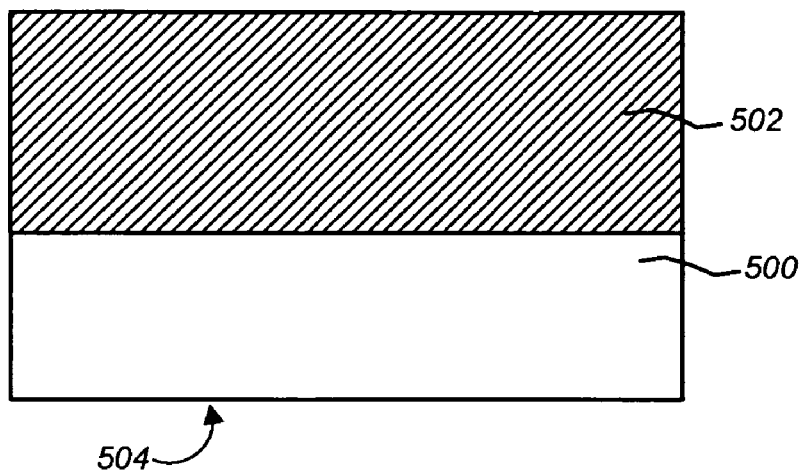
FIG._21
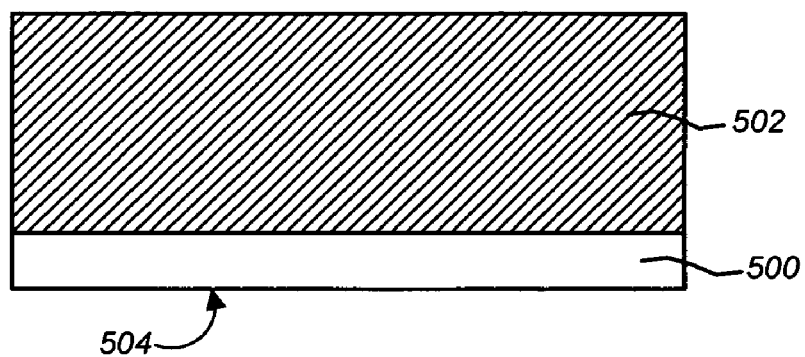
FIG._22
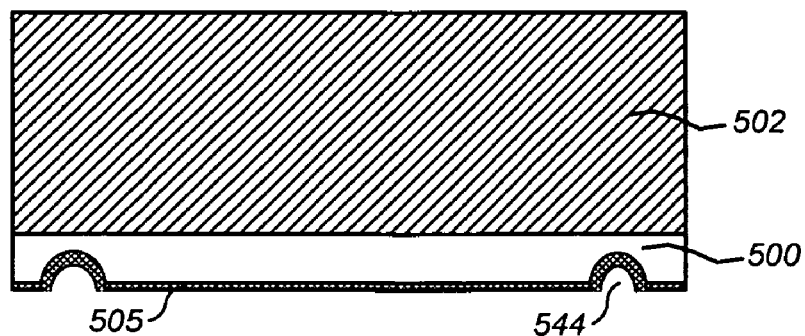
FIG._23

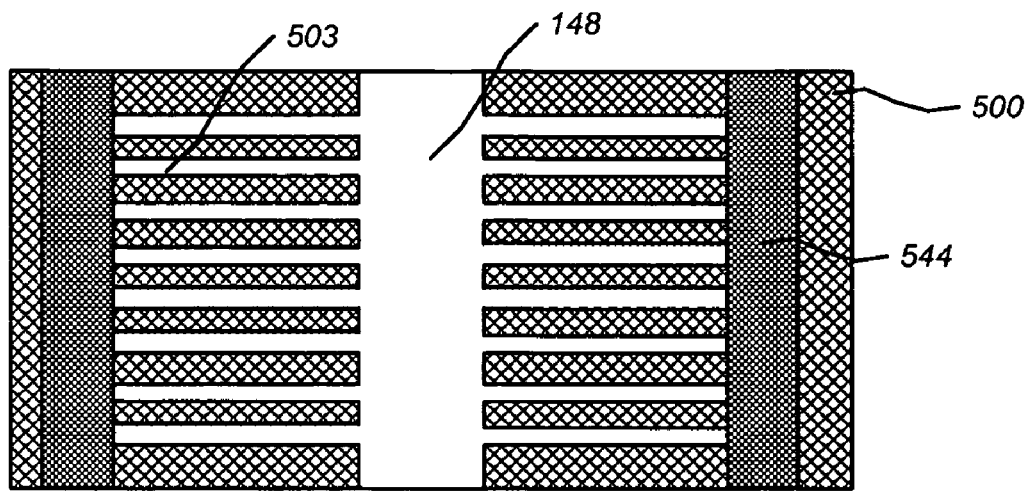
FIG._24
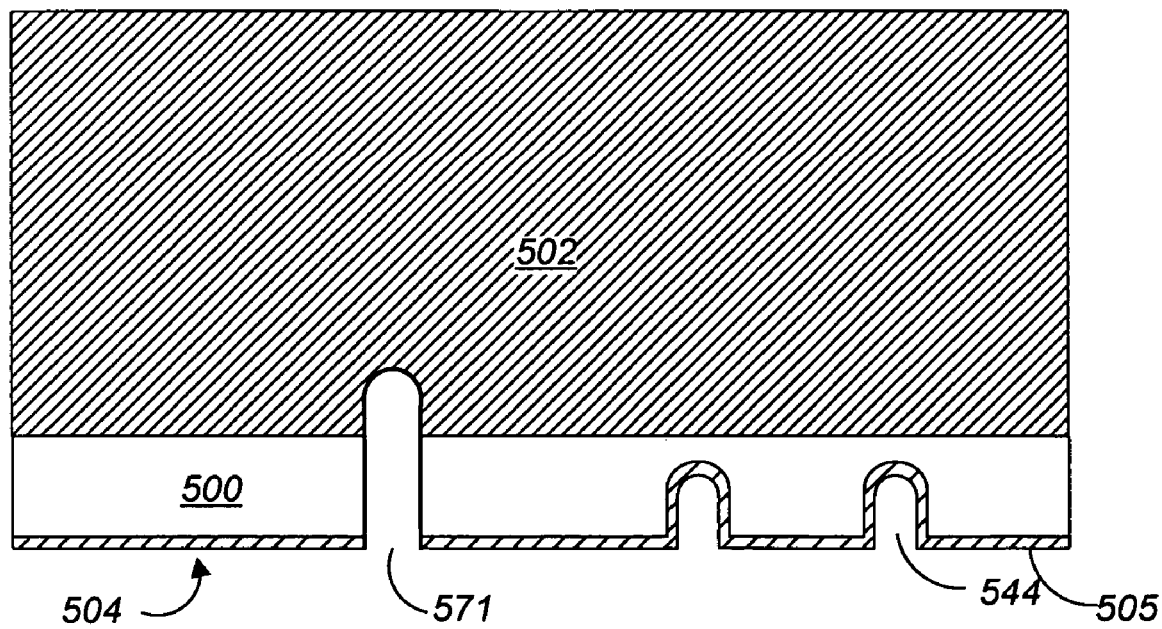
FIG._25

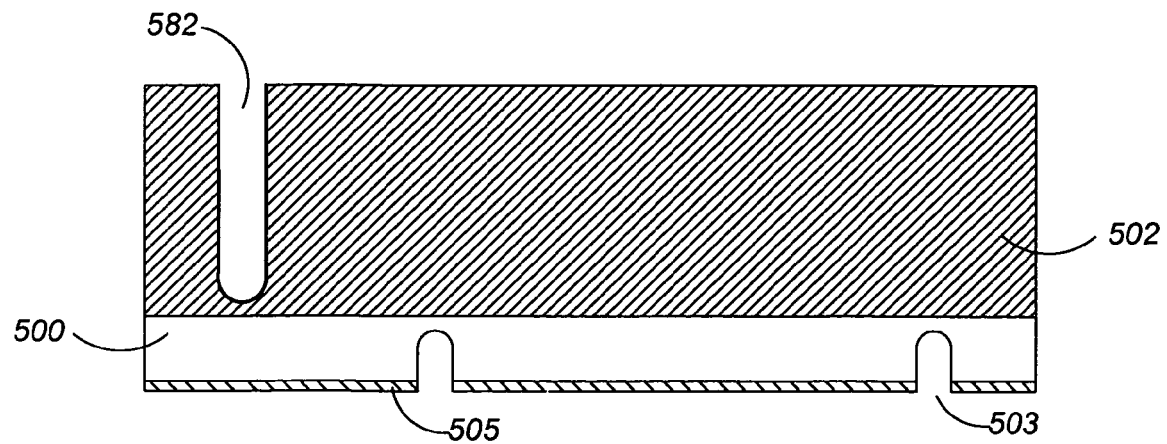
FIG._26
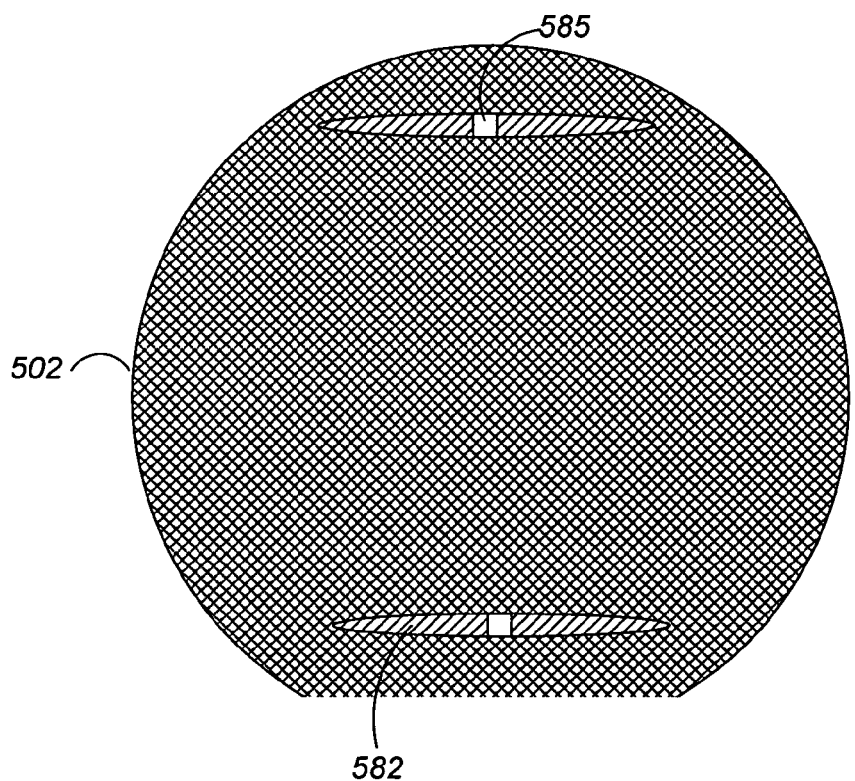
FIG._27

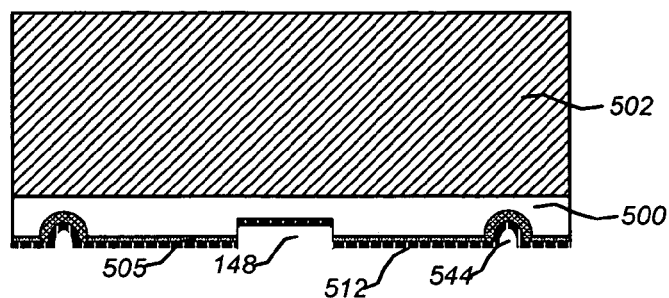
FIG._28
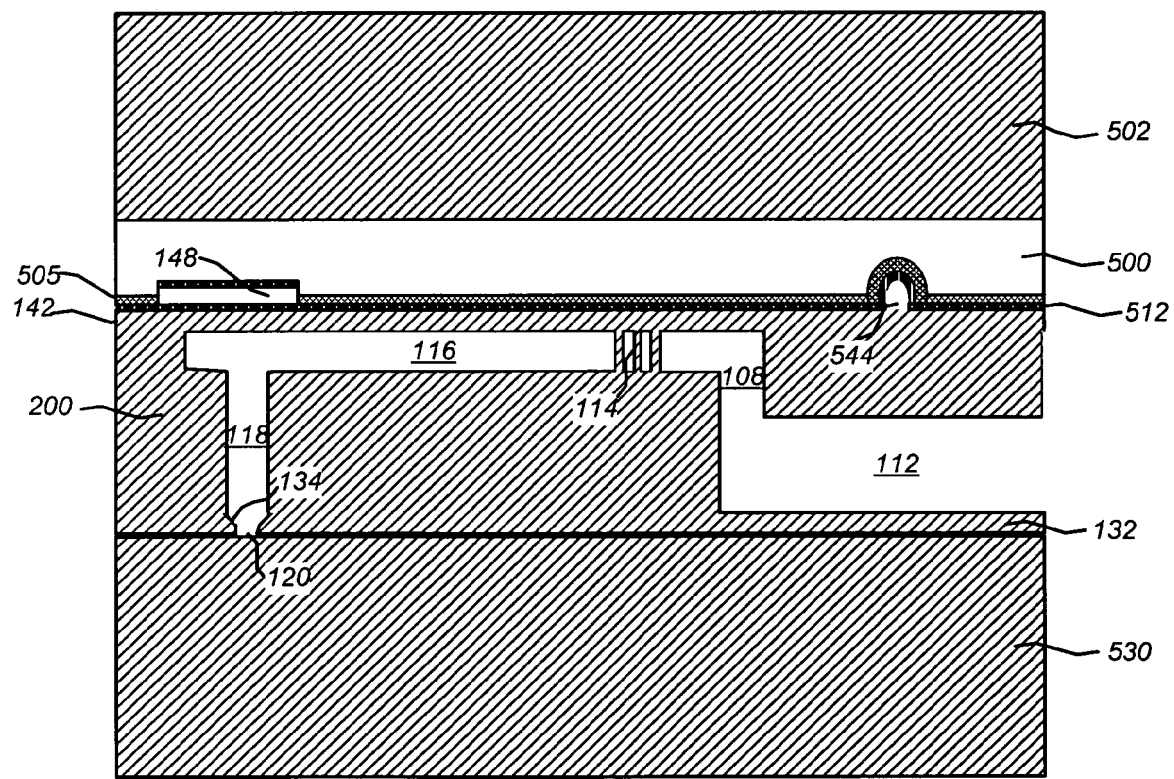
FIG._29

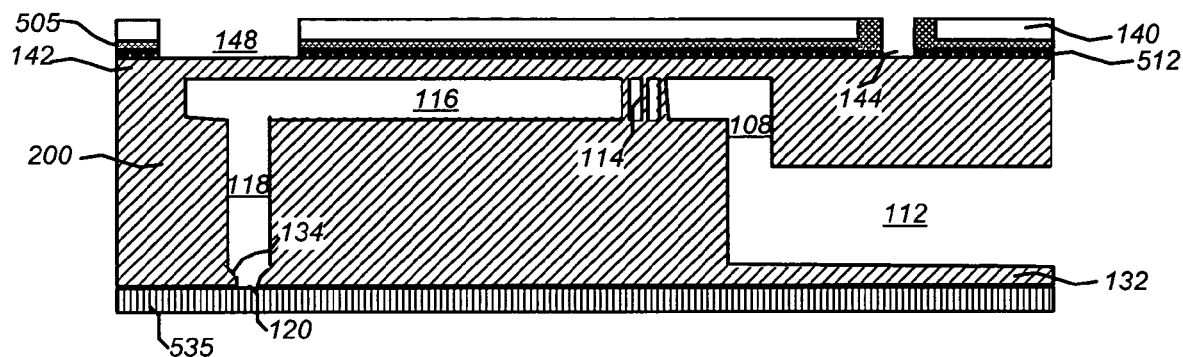
FIG._30
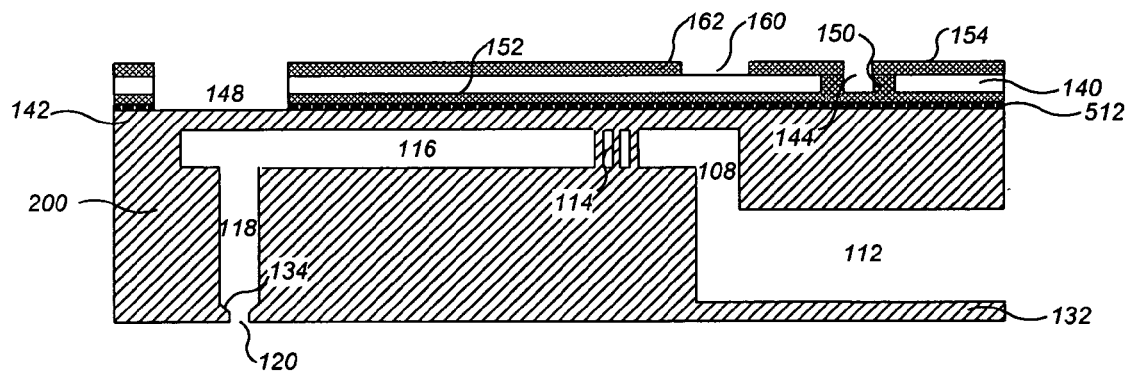
FIG._31

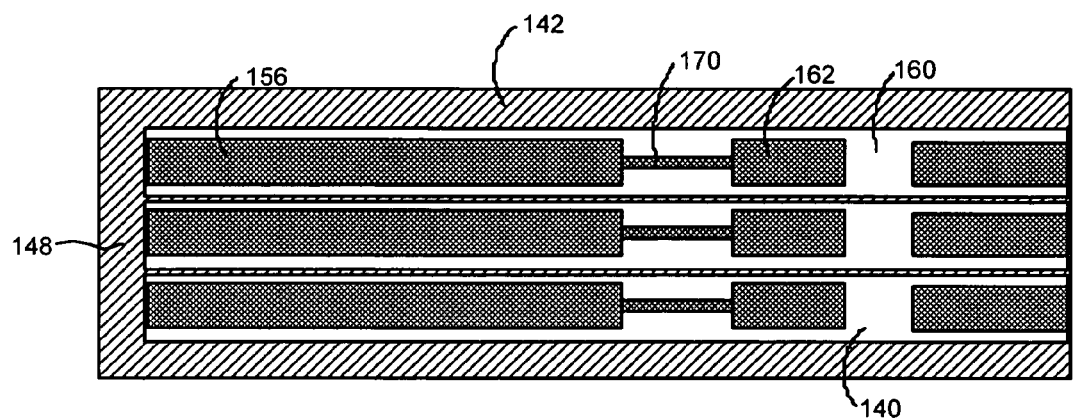
FIG._32
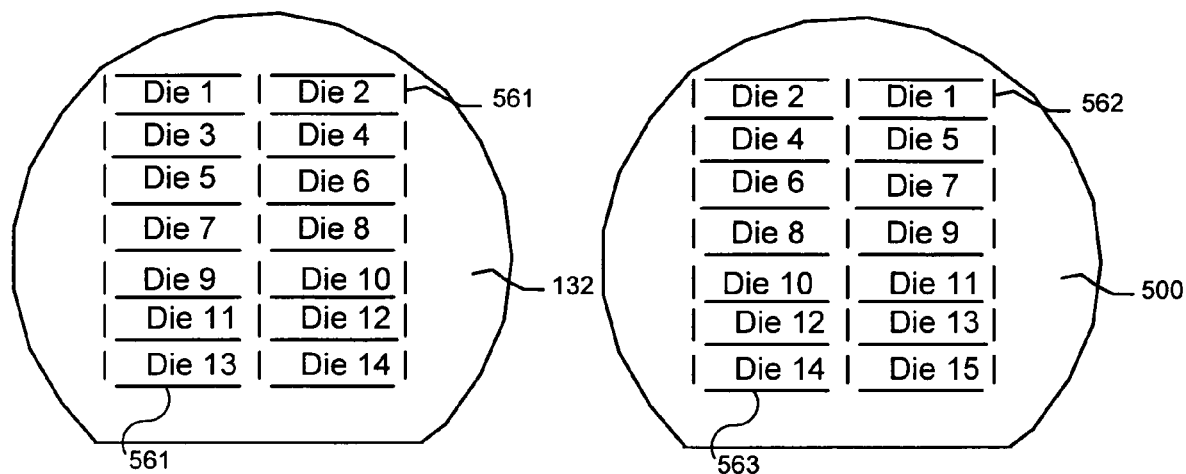
FIG._33A  FIG._33B

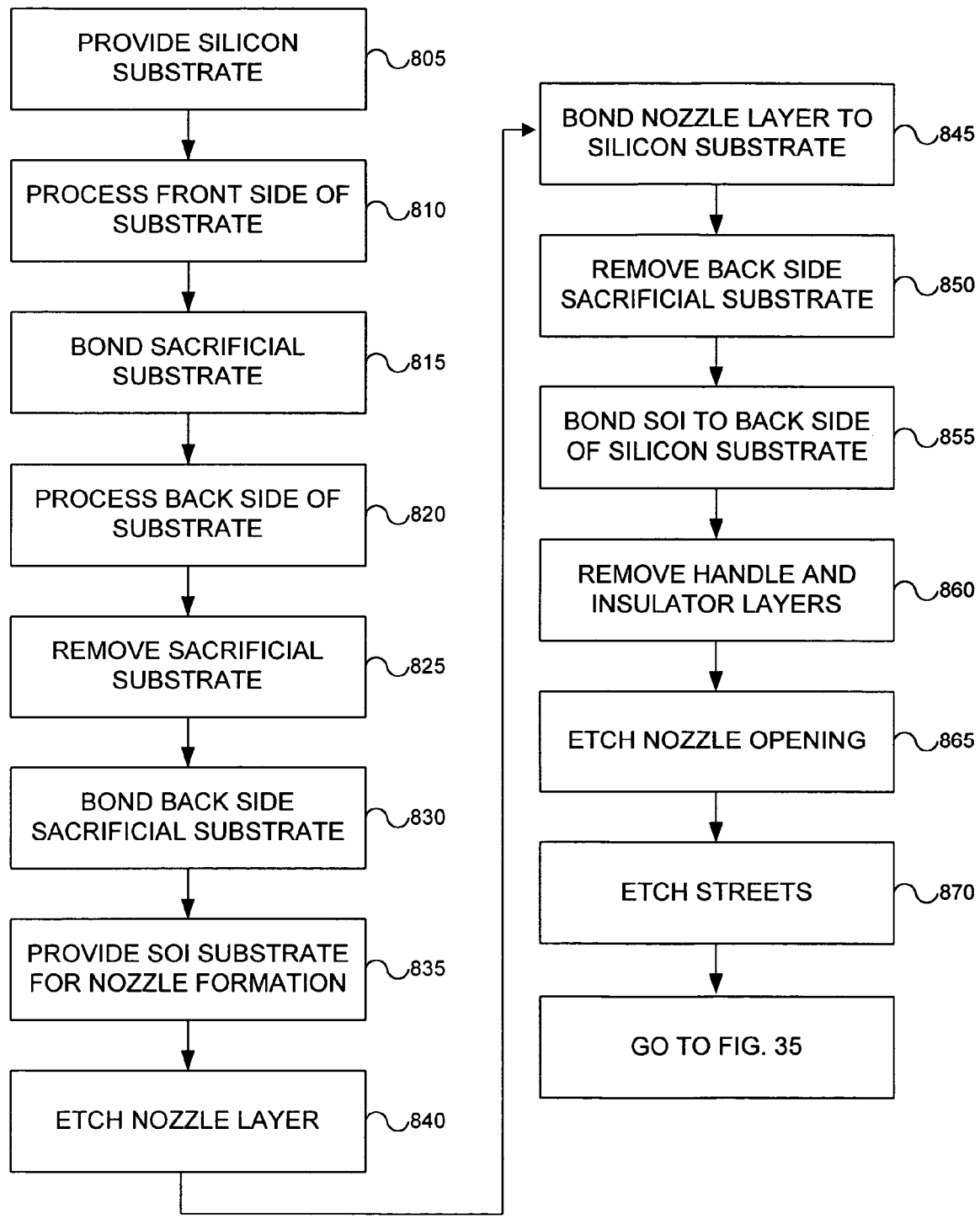
FIG._34

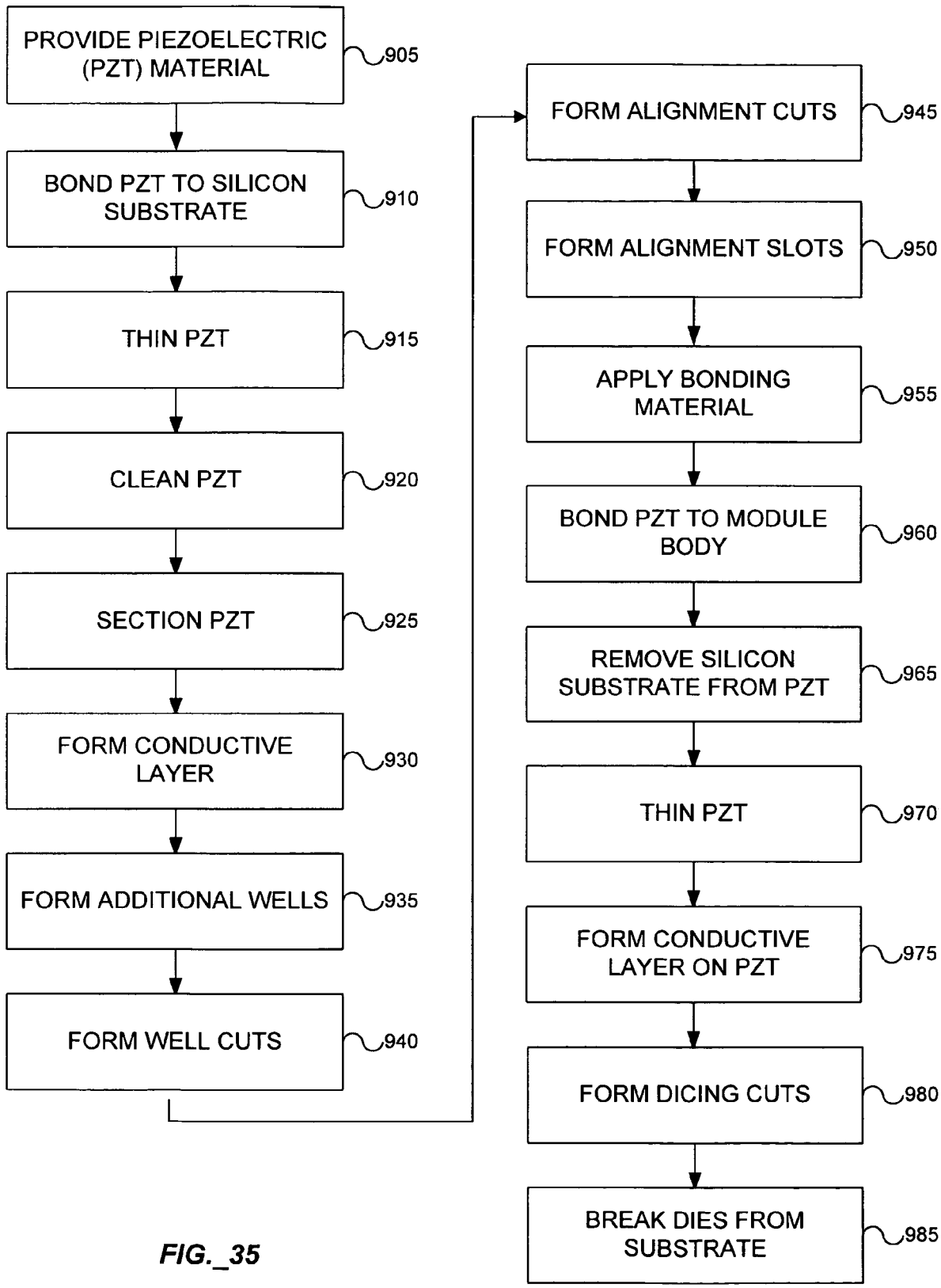
*FIG._35*

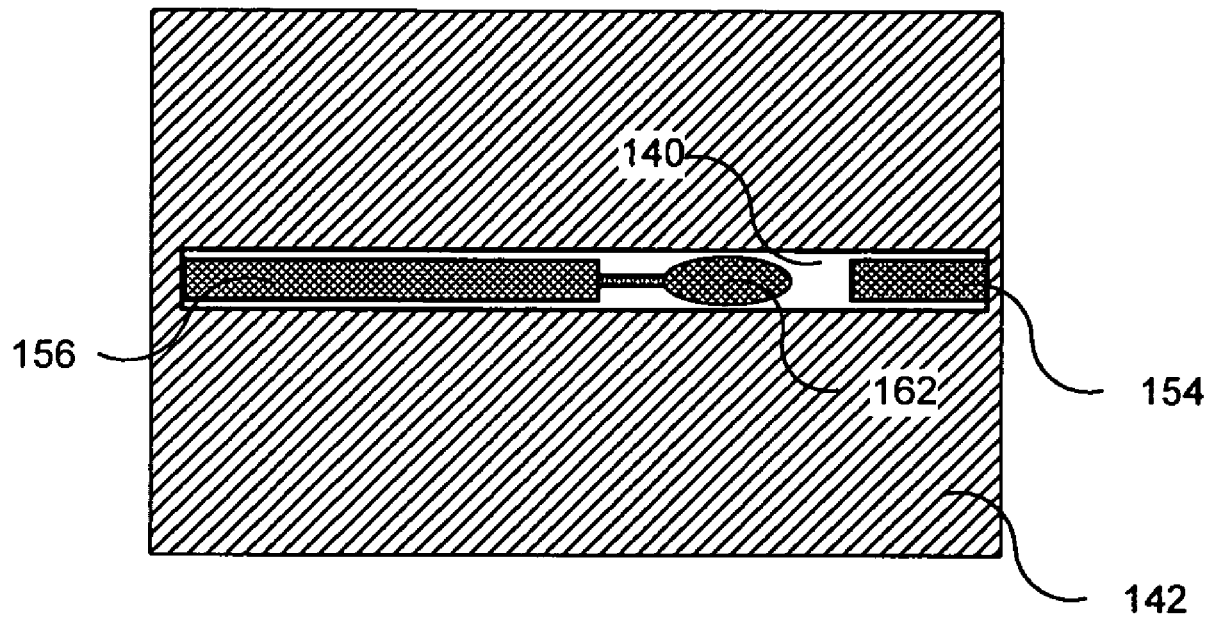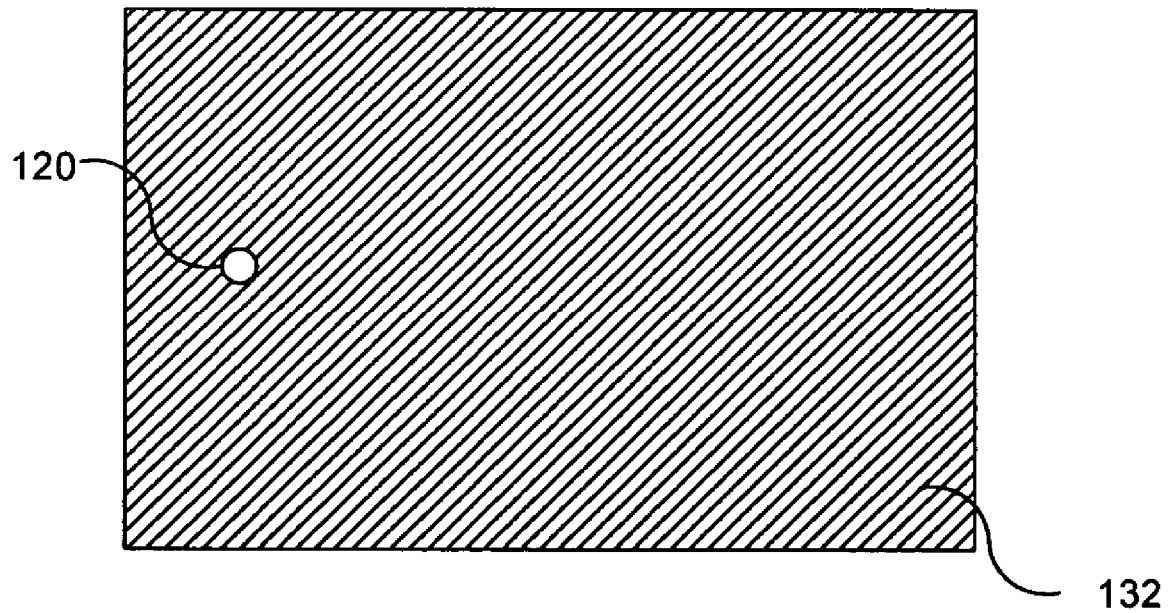
FIG._36A

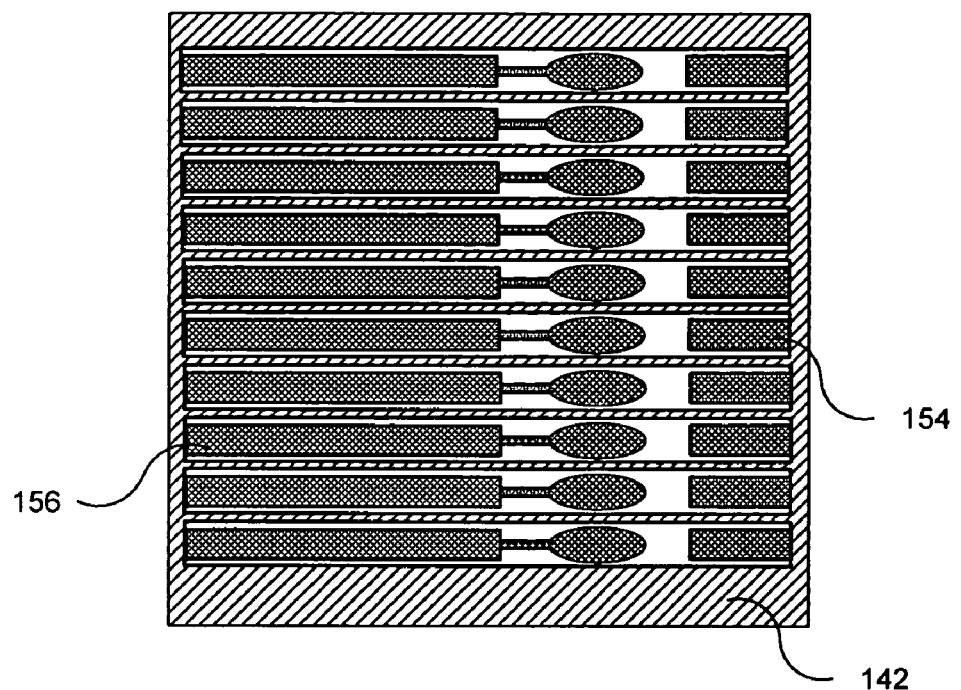
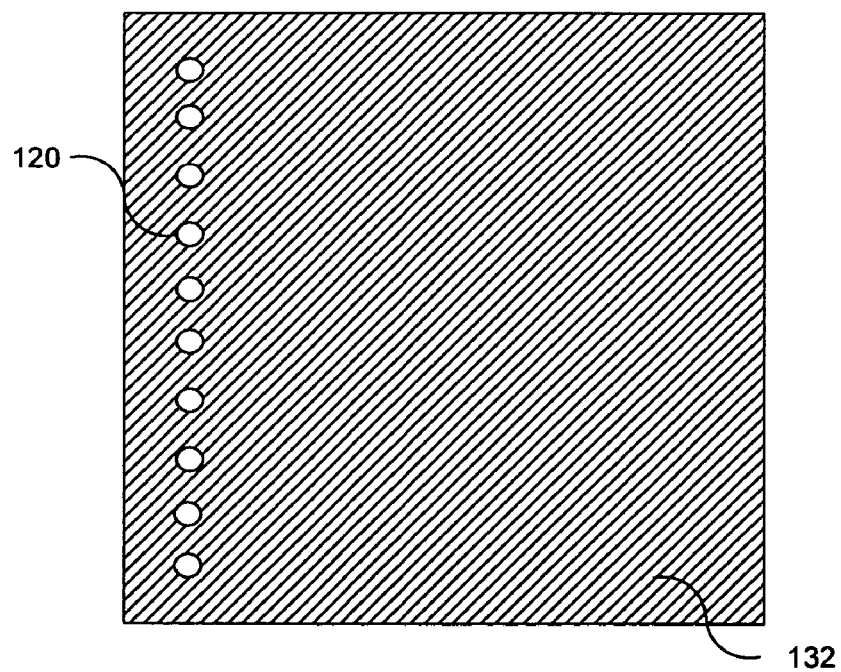
FIG._36B

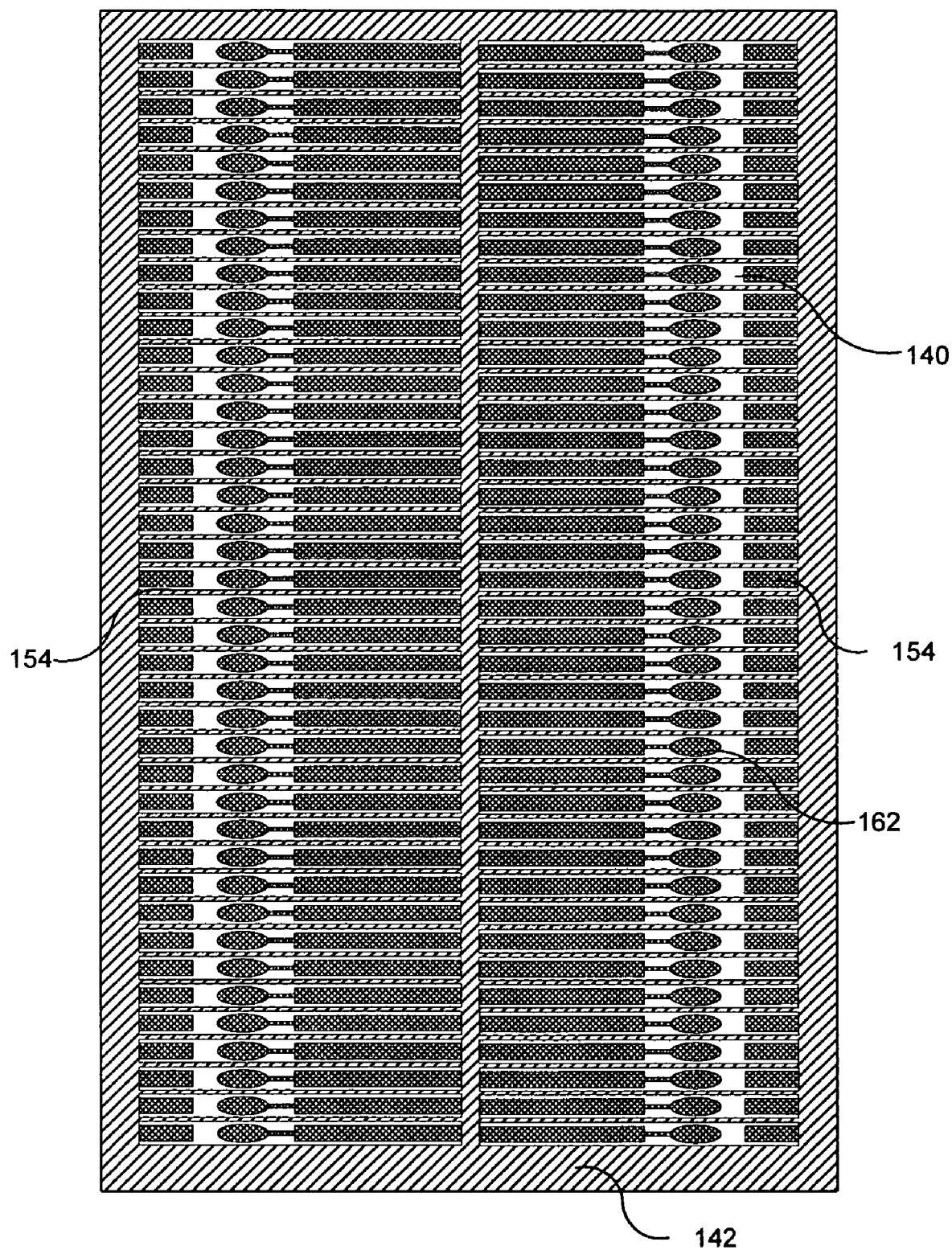
FIG._36C

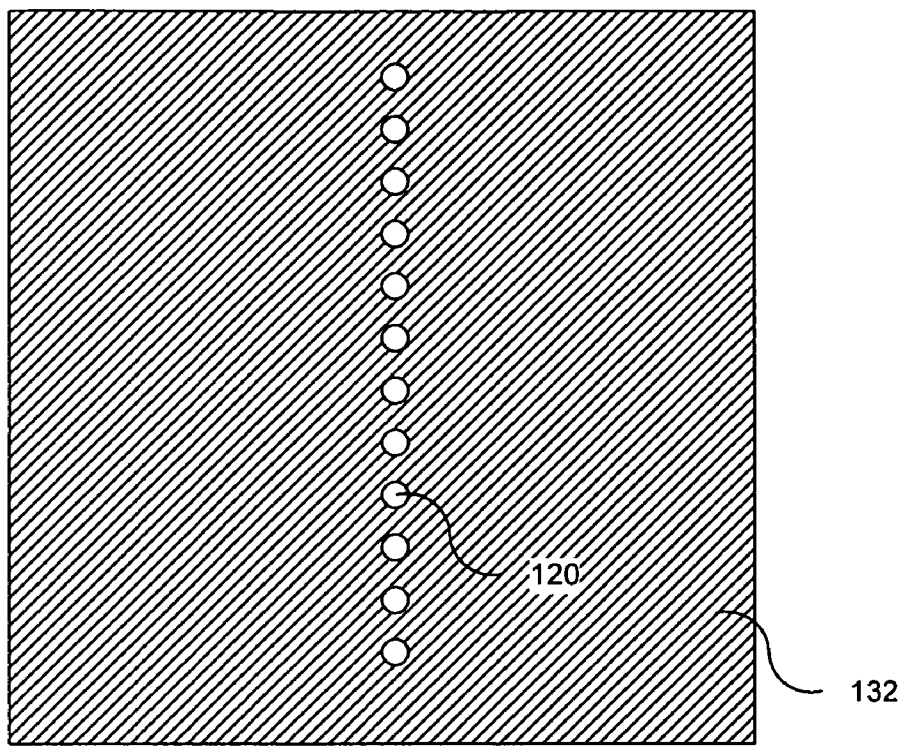
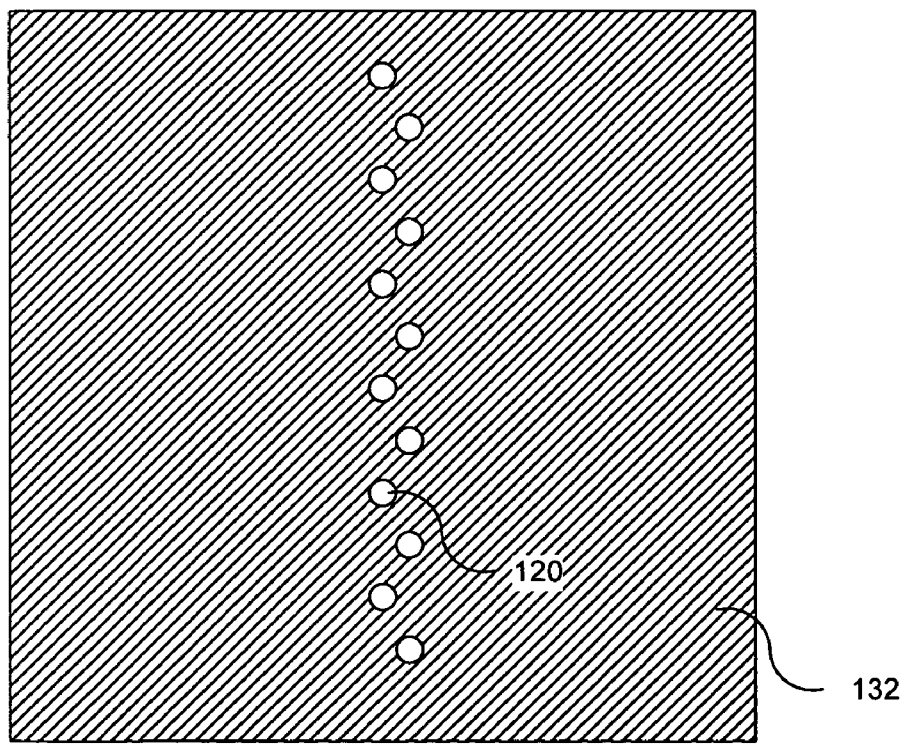
FIG._37

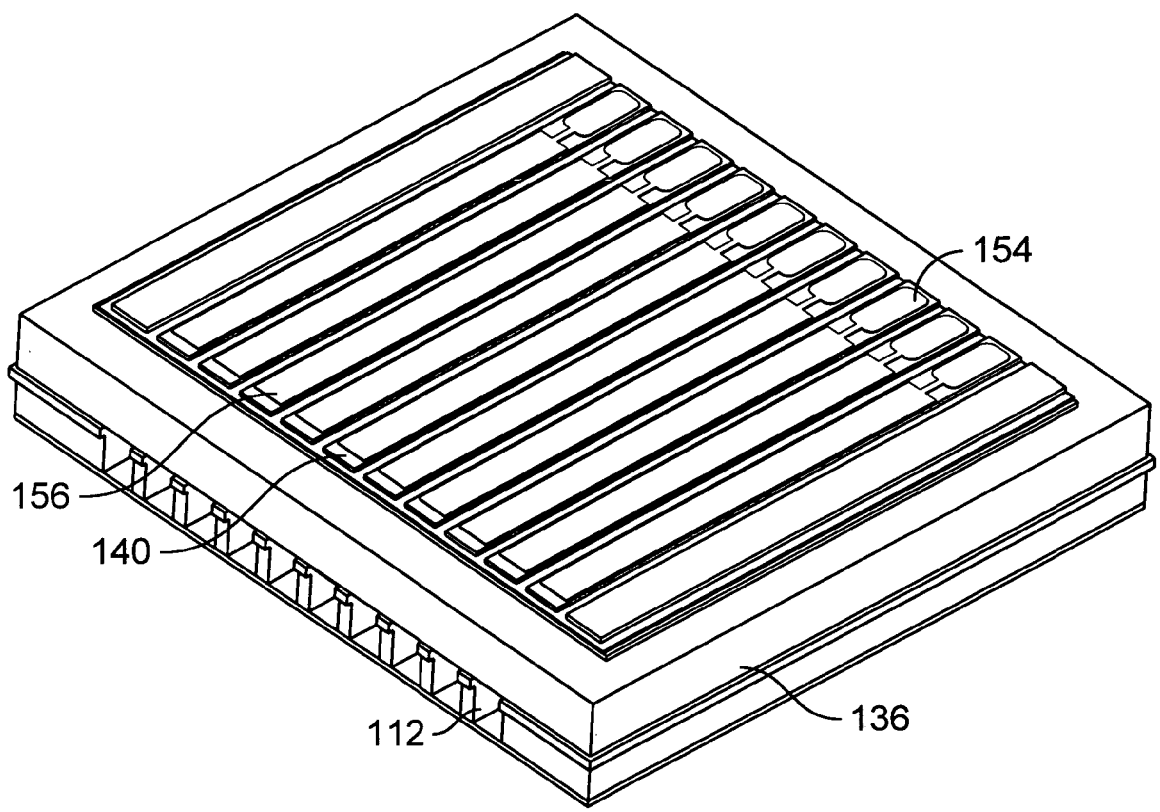
FIG._38

SACRIFICIAL SUBSTRATE FOR ETCHING

CROSS-REFERENCE TO RELATED APPLICATIONS

This application claims priority to U.S. Provisional Application Ser. No. 60/621,507, filed Oct. 21, 2004. The disclosure of the prior application is considered part of and is incorporated by reference in the disclosure of this application.

BACKGROUND

This invention relates to silicon substrate processing.

A microelectromechanical system (MEMS) typically has mechanical structures formed in a semiconductor substrate using conventional semiconductor processing techniques. A MEMS can include a single structure or multiple structures. MEMS have an electrical component, where an electrical signal activates each or is produced by actuation of each structure in the MEMS.

Various processing techniques are used to form MEMS. These processing techniques can include layer formation, such as deposition and bonding, and layer modification, such as laser ablation, punching and cutting. The techniques that are used are selected based on a desired pathway, recess and hole geometry to be formed in a body along with the material of the body.

One implementation of a MEMS includes a body having chambers formed therein and a piezoelectric actuator formed on an exterior surface of the body. The piezoelectric actuator includes a layer of piezoelectric material, such as a ceramic, and elements for transmitting a voltage, such as electrodes. The electrodes of the piezoelectric actuator can either apply a voltage across the piezoelectric material or transmit a voltage that is produced when the piezoelectric material is deformed.

One type of MEMS with piezoelectric actuators are microfluidic ejection devices. An actuator can include piezoelectric material that can be actuated by electrodes, causing the piezoelectric material to deform towards a chamber of the device. This deformed actuator pressurizes the chamber, causing fluid in the chamber to exit, for example, through a nozzle. The structure components, including the actuator, the chamber and the nozzle, can affect how much fluid is ejected. In a MEMS with multiple structures, forming uniformly sized components for each structure across the MEMS can improve the uniformity of performance of the MEMS, such as the uniformity of fluid quantities that are ejected. Forming uniform structures can be challenging when attempting to process each structure to have measurements that are within a few microns of other structures in the MEMS.

SUMMARY

In general, in one aspect the invention describes a method of etching a silicon substrate. The method includes bonding a first silicon substrate to a sacrificial silicon substrate. The first silicon substrate is etched. A pressure is applied at an interface of the first silicon substrate and the sacrificial silicon substrate to cause the first silicon substrate to separate from the sacrificial silicon substrate.

Implementations of the method can include one or more of the following features. The bonding can include creating Van der Waals bonds between the first silicon substrate and the sacrificial silicon substrate and can occur at room temperature. The etch can be a deep reactive ion etch and can etch into the sacrificial substrate. Applying a pressure at the interface of the first silicon substrate and the sacrificial silicon substrate can include pressing a member having a sharp edge at the interface, such as until the first silicon substrate is completely separated from the sacrificial substrate. The first silicon substrate and the sacrificial silicon substrate can each include opposed flat surfaces and a thin edge and applying a pressure at an interface can include applying pressure parallel to the flat surfaces.

In another aspect, the invention describes an apparatus for separating two bonded substrates. The apparatus includes a substrate holding member and one or more separating members. A mechanism is connected to at least one of the separating members, wherein the mechanism translates the separating member in a direction toward a center of a substrate held by the substrate holding member.

Implementations of the apparatus can include one or more of the following features. The separating member can include a thin edge portion, such as a metal blade. The substrate holding mechanism can be actuable in an upward and downward direction. The mechanism can include a motor. The apparatus can include a sensor for sensing pressure applied by the one or more separating members. The apparatus can include a controller configured to move the at least one separating member according to signals received from the sensor. The apparatus can include a controller configured to halt inward motion of the separating member when pressure exceeds a threshold. The apparatus can have two, four, six, eight or more separating members. The separating members can be spaced at equal angular intervals around the holding member. The mechanism can prevent the separating members from translating beyond a predetermined location.

Fusion bonding substrates can provide a support for the module substrate during processing. Fusion bonding can provide a stable, yet impermanent, bond if the silicon substrates are not annealed. The sacrificial substrate can enable etching through a substrate from one surface without forming an undercut at the opposed surface of the substrate. The sacrificial substrate can prevent chemicals from passing through the aperture formed in the substrate, e.g., the substrate can prevent cooling agents on one side of the substrate from escaping into an etching chamber. When one portion of the etch is complete, and another is incomplete, the sacrificial substrate prevents overetching from occurring in the areas that are complete. The sacrificial substrate can also prevent unwanted debris from entering the holes or recesses of an etched substrate during handling.

A mechanical separating device can separate the fusion bonded substrates without requiring a human to perform the tedious process. By including sensors with the device, the proper level of pressure can be applied to the substrates during separation without risking damage to the substrates.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 is cross-sectional view of a droplet ejection MEMS device.

FIG. 2 is a top view of three electrodes from the droplet ejection MEMS device.

FIG. 3 shows a silicon substrate.

FIG. 4 is a cross sectional view of a partially etched silicon substrate.

FIG. 5 is a cross sectional view of a partially etched silicon substrate bonded to a sacrificial substrate.

FIG. 6 is a cross sectional view of a partially etched silicon substrate with patterned photoresist and oxide layers.

FIG. 7 is a cross sectional view of a partially etched silicon substrate with patterned photoresist and oxide layers.

FIG. 8 is a cross sectional view of the silicon substrate after the thru holes are completed.

FIG. 9 is a cross sectional view of the silicon substrate after a pumping chamber has been formed.

FIG. 10 shows the etched substrate with the sacrificial substrate removed.

FIG. 11 shows a schematic of a mechanical device for separating bonded substrates.

FIG. 12 is a cross sectional view of the mechanical device for separating bonded substrates.

FIG. 13 shows the etched substrate bonded to a second sacrificial substrate.

FIG. 14 shows a silicon on insulator substrate with a device layer for forming a nozzle layer.

FIG. 15 shows the silicon on insulator substrate after anisotropic etching.

FIG. 16 shows a top view of the silicon on insulator substrate after anisotropic etching.

FIG. 17 is a cross sectional view of the etched substrate bonded to two silicon on insulator substrates.

FIG. 18 is a cross sectional view of the etched substrate with an exposed membrane layer and an exposed nozzle layer.

FIG. 19 shows a monolithic silicon substrate with etched features.

FIG. 20 is a cross sectional view of the nozzle layer with the nozzle opening.

FIG. 21 shows a piezoelectric layer bonded to a handle layer.

FIG. 22 shows the piezoelectric layer after thinning.

FIG. 23 shows the piezoelectric layer after forming ground cuts and a conductive layer.

FIG. 24 is a bottom view of the piezoelectric layer after forming additional cuts.

FIG. 25 is a cross sectional view of the piezoelectric layer with an alignment cut formed therein.

FIG. 26 is a cross sectional view of the handle layer with an alignment slot formed therein.

FIG. 27 is a top view of the handle layer after forming the alignment cuts and slots.

FIG. 28 is a cross sectional view of the piezoelectric layer after a bonding layer has been formed thereon.

FIG. 29 shows the module substrate and the piezoelectric layer bonded together.

FIG. 30 shows the assembly after removing the handle layer.

FIG. 31 shows the assembly after forming an upper conductive layer.

FIG. 32 is a top view of three electrodes formed on piezoelectric islands.

FIGS. 33A, 33B, 33C and 33D show a schematic of die locations on a substrate and streets and dicing cuts around the dies for separating the dies from the substrate.

FIG. 34 is a flow diagram for forming the module substrate.

FIG. 35 shows a flow diagram describing the process of forming piezoelectric islands and completing the MEMS.

FIGS. 36A, 36B, and 36C show dies with one or more structures.

FIG. 37 is a bottom view of the nozzle openings.

FIG. 38 shows a perspective view of one example of a die.

Like reference symbols in the various drawings indicate like elements.

DETAILED DESCRIPTION

Figure 33C:
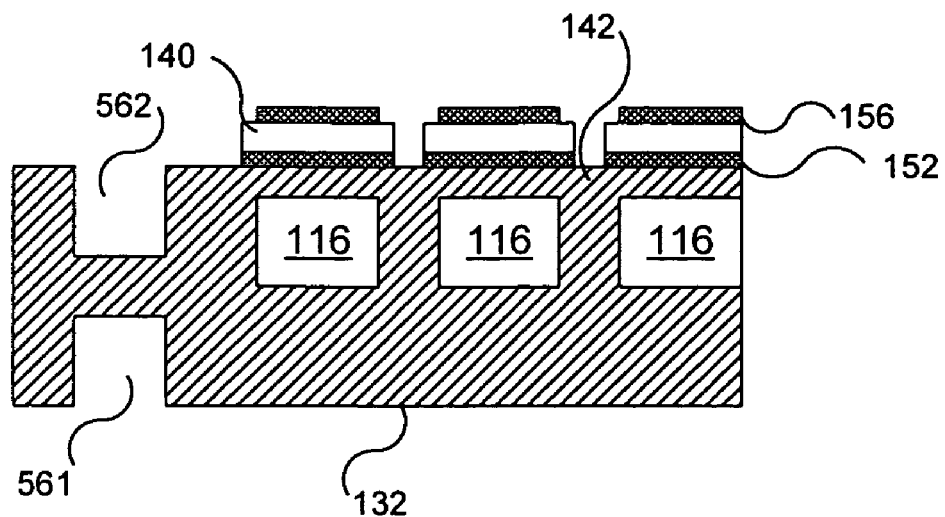

A MEMS with a monolithic structure and precisely formed features can be formed using a variety of techniques. Precision in the features can lead to uniform behavior of each structure included in the MEMS. A variety of MEMS can be formed using the same or similar techniques. One type of MEMS, a printing apparatus, is described below. However, the techniques used to form the printing apparatus can be applied to forming a number of other MEMS structures, such as, fluid ejectors, sensors, microphones, light modulators and other such devices.

Multiple jetting structures can be formed in a single printhead die. During manufacture, multiple dies can be formed contemporaneously on a single wafer. In many of the figures below, one jetting structure is described for the sake of simplicity.

Referring to FIG. 1, a cross-section through a flow path of a single jetting structure in a module 100, ink enters the module 100 through a supply path 112, and is directed through an ascender 108 to an impedance feature 114 and a pumping chamber 116. Ink is pressurized in the pumping chamber 116 by an actuator 122 and directed through a descender 118 to a nozzle opening 120 from which drops are ejected.

The flow path features are defined in a module body 124. The module body 124 includes a base portion, a nozzle portion and a membrane. The base portion includes a base layer of silicon (base silicon layer 136). The base portion defines features of the supply path 112, the ascender 108, the impedance feature 114, the pumping chamber 116 and the descender 118. The nozzle portion is formed of a silicon layer (nozzle silicon layer 132). The nozzle silicon layer 132 is fusion bonded (dashed line) to the base silicon layer 136 of the base portion and defines tapered walls 134 that direct ink from the descender 118 to the nozzle opening 120. The membrane includes a membrane silicon layer 142 that is fusion bonded to the base silicon layer 136, on a side opposite to the nozzle silicon layer 132.

The actuator 122 includes a piezoelectric layer 140. A conductive layer under the piezoelectric layer 140 can form a first electrode, such as a ground electrode 152. An upper conductive layer on the piezoelectric layer 140 can form a second electrode, such as a drive electrode 156. A wrap-around connection 150 can connect the ground electrode 152 to a ground contact 154 on an upper surface of the piezoelectric layer 140. An electrode break 160 electrically isolates the ground electrode 152 from the drive electrode 156. The metallized piezoelectric layer 140 can be bonded to the silicon membrane 142 by an adhesive layer 146. The adhesive layer can include an adhesive, such as a resin, for example polymerized benzocyclobutene (BCB).

The metallized piezoelectric layer 140 can be sectioned to define active piezoelectric regions, or islands, over the pumping chambers. The metallized piezoelectric layer 140 can be sectioned to provide an isolation area 148. In the isolation area 148, piezoelectric material can be removed from the region over the descender 118. This isolation area 148 can separate arrays of actuators on either side of a nozzle array.

A flex circuit (not shown) can be secured to the back surface of the actuator 122 for delivering drive signals that control ink ejection.

The module 100 is a generally rectangular solid. In one implementation, the module 100 is between about 30 and 70 mm long, 4 and 12 mm wide and 400 to 1000 microns thick. The dimensions of the module can be varied, e.g., within a semiconductor substrate in which the flow paths are etched, as will be discussed below. For example, the width and length of the module may be 10 cm or more.

The thickness uniformity of the monolithic body, and among monolithic bodies of multiple modules in a printing apparatus, can be high. For example, thickness uniformity of the monolithic bodies, can be, for example, about ±1 micron or less for a monolithic body formed across a six inch polished silicon substrate. As a result, dimensional uniformity of the flow path features etched into the substrate is not substantially degraded by thickness variations in the body.

Referring to FIG. 2, a top view illustrates a series of upper electrodes 156 corresponding to adjacent flow paths. Each flow path can have an upper electrode 156 connected through a narrow electrode portion 170 to a drive electrode contact 162 to which an electrical connection is made for delivering drive pulses. The narrow electrode portion 170 can be located over the impedance feature 114 and can reduce current loss across a portion of the actuator 122 that need not be actuated.

Module Manufacture

The module body 124 is manufactured by etching flow path features in the base portion and the nozzle portion. The membrane layer, base portion and nozzle portion are bonded together to form the module body. The actuator is then attached to the module body.

Referring to FIG. 3, flow path features in the base silicon layer 136 are formed in a silicon substrate 200. A silicon substrate 200 is provided having a front side 210 and a back side 215 (step 805, FIG. 34).

The silicon substrate 200 can have an overall thickness of about 600 microns. The substrate can have thermal oxide layers 203, 208, each about 1 micron thick, on the front side 210 and back side 215, respectively. The substrate 200 can be piranha cleaned in a bath of sulfuric acid/hydrogen peroxide to remove the organics from the substrate 200. The silicon layer can be a single-crystal silicon with the (100) plane parallel to the front and back sides 210, 215.

Referring to FIG. 4, the substrate 200 can be processed to form portions corresponding to the descender 118 and supply path 112 by etching through a photoresist that is patterned to form a mask (step 810, FIG. 34). To prepare the substrate 200 for the photoresist, the substrate can be placed in hexamethyldisilazane (HMDS) fumes to prime the oxide for the photoresist. A positive photoresist 225 is spun onto the front side 210 of the substrate 200. The photoresist can be soft baked, and exposed through a chrome mask using a Karl Suss mask aligner. The photoresist can be developed to form a mask defining the locations of the descender 118 and the supply path 112.

Next, the substrate 200 is etched. The oxide layer 203 can be removed by an inductively coupled plasma reactive ion etching (ICP RIE). The silicon layer is then etched. An example of an etching process is isotropic dry etching by deep reactive ion etching, which utilizes plasma to selectively etch silicon to form features with substantially vertical sidewalls. A reactive ion etching technique known as the Bosch process is discussed in Laermor et al. U.S. Pat. No. 5,501,893, the entire contents of which is incorporated hereby by reference. Deep silicon reactive ion etching equipment is available from Surface Technology Systems, Redwood City, Calif., Alcatel, Plano, Tex., or Unaxis, Switzerland, and reactive ion etching can be conducted by etching vendors including Innovative Micro Technology, Santa Barbara, Calif. Deep reactive ion etching is used due to the ability to cut deep features of substantially constant diameter. Etching is performed in a vacuum chamber with plasma and gas, such as $SF_6$ and $C_4F_8$. In one implementation, the back surface of the substrate is cooled. Defects in the substrate can be caused by the heat created during the etching process. A cooling agent, such as helium, can be used to cool the substrate. A metal layer between the silicon substrate and the cooling agent can conduct heat generated by the etching process to the cooling agent efficiently, as well as prevent the cooling agent from escaping into the vacuum chamber and destroying the vacuum.

The silicon substrate 200 can be etched using the Bosch process deep reactive ion etching (DRIE) to define the front side half of the descenders 118 and the supply path 112. The silicon is etched to a depth of about 300 microns. The resist can be stripped from the substrate 200, and the substrate 200 can be piranha cleaned and RCA cleaned.

Referring to FIG. 5, the silicon substrate 200 is bonded to a sacrificial substrate 240, using, for example, a vacuum bonder (step 815, FIG. 34). The front side 210 of the silicon substrate 200 can be bonded to the sacrificial substrate 240. The sacrificial substrate 240 can be a silicon substrate. Optionally, any oxide layers can be stripped from the substrates prior to bonding. The silicon substrate 200 and the sacrificial substrate 240 can be fusion bonded, or silicon-to-silicon bonded, together. The bonding is performed at about room temperature, to prevent the substrates 200, 240 from being permanently bonded together.

Fusion bonding, which creates Van der Waal's bonds between the two silicon surfaces, can occur when two flat, highly polished, clean silicon surfaces are brought together with no intermediate layer between the two silicon layers. Fusion bonding can also occur between silicon oxide and silicon. To prepare the two elements for fusion bonding, the silicon substrate 200 and the sacrificial substrate 240 are both cleaned, such as by reverse RCA cleaning. In one implementation, the RCA cleaning is a reverse RCA clean, i.e., an RCA2 clean consisting of a mixture of DI water, hydrochloric acid and hydrogen peroxide followed by an RCA1 clean in a bath of DI water, ammonium hydroxide and hydrogen peroxide. Any oxide on the silicon substrate 200 and the sacrificial substrate 240 can optionally be removed with a buffered hydrofluoric acid etch (BOE). The silicon substrate 200 and the sacrificial substrate 240 are then brought together. The two substrates are bonded together, such that the substrates can be separated, as described further below. No annealing is performed when a temporary bond is desired.

Referring to FIG. 6, a photoresist 234, such as a positive photoresist, can be spun onto the back side oxide layer 203 using the above described method. The photoresist 234 can be patterned to define the location of the pumping chamber 116 and the impedance feature 114 in the pumping chamber 116. The substrate is etched, such as with a plasma etch, to remove exposed portions of the oxide layer 203, but the silicon substrate 200 is not etched.

Referring to FIG. 7, the photoresist 234 is stripped and a new photoresist layer 238 is spun onto the back side of the substrate. The new photoresist layer 238 is patterned to define the location of the descender 118 and ascender 108. As shown in the following figures, multiple layers of patterning photoresist and etching can be used to create multilevel features.

Referring to FIG. 8, the back side 215 of the silicon substrate 200 is etched, such as by DRIE, to form the back side portion of the descender 118 and the back side portion of the ascender 108 (step 820, FIG. 34). The sacrificial substrate 240 serves as a layer that can be etched into when the back side 215 of the silicon substrate 200 is etched. In addition, the sacrificial substrate can prevent the formation of an undercut, which can occur at the junction of two different materials that are etched. The sacrificial silicon substrate 240 also seals the silicon substrate 200 to prevent the cooling agent of the DRIE apparatus from passing through the ascender or descender and into the DRIE process chamber. The photoresist 238 is stripped after the back side portions of the descender 118 and ascender 108 are etched.

Referring to FIG. 9, using the previously patterned silicon dioxide layer 203 as a mask, the silicon substrate 200 is etched to form the pumping chamber 116 and the impedance feature 114. Fiducials (not shown) can be etched in a perimeter of the substrate 200.

Referring to FIG. 10, the sacrificial substrate 240 is removed from the silicon substrate 200 (step 825, FIG. 34). Silicon substrates that have been fusion bonded together, but not annealed, can be separated by gently wedging a separating member between the two substrates. The Van der Waals bonds are sufficiently weak to be broken without damaging the substrate, particularly if the separation is performed sufficiently slowly.

Referring to FIGS. 11 and 12, a mechanical device 600 can separate the sacrificial substrate 240 from the silicon substrate 200. The device 600 can include a substrate support 610 that can be actuated up and down. One or more separator units 630, such as four, six, eight or even more separator units, can be used to separate the substrates. If the device includes two or more separator units 630, the units can be spaced at equal angular intervals around the substrate support 610. The separator units 630 can include a separating member 620, e.g., a blade-shaped projection. The separating member 620 can have an edge that is sufficiently thin so that when the separating member 620 applies pressure to the interface between the two substrates, the separating member 620 forces the two substrates apart and can enter between the two substrates. The separating member 620 is formed of a material that is sufficiently stiff that it does not break when applying a pressure sufficient to separate the two substrates. The separating member 620 can have a substantially uniform thickness or it can taper to a thinner edge. In one implementation, the separating member 620 is formed of a thin blade of metal with a sharp leading edge, e.g., a razor blade.

Each separator unit 630 can include a holding member, e.g., a clamp, for securing the separating member 620. The separator units 630 can be independently radially actuated in an inward and outward direction, with respect to a central axis perpendicular to the surface of the substrate support 610. Each separator unit 630 can be actuated by a motor 650 that drives the separator unit along a support rail 640. Each separator unit 630 can also house a sensor to measure the pressure applied by the separating member 620. Each motor 650 and sensor can be connected to a controller 660, e.g., a programmed computer.

To separate the two substrates, the controller 660 causes the motor 650 to move the separator units 630 inward. The substrate assembly has a primary face 680 and a thin side 670. The separator units 630 move in a direction perpendicular to the thin side 670 of the bonded substrates and parallel to the primary face 680. The separator units 630 are moved until the sensor detects that the applied pressure exceeds a threshold pressure. When the sensor detects the threshold pressure, the sensor can instruct the motor 650 to stop the inward movement of the separator units 630. As the two substrates 200, 240 begin to pull away from one another the pressure applied by the separator will fall. When the sensor detects that the pressure has fallen below the threshold pressure, the controller 660 can instruct the motor 650 to move the separator units 630 inwardly again until the threshold pressure is again detected or until the separator units 630 are moved inward to their furthest extent. For a device having multiple separator units 630, the separator units 630 can be moved in series or together at one time.

In operation, the two bonded substrates are placed on the substrate support 610. The substrate support 610 can be in an elevated position. The separator units 630 are moved in toward the substrates. The separator units 630 can be actuated in an upward or downward direction, or the substrate support 610 can be actuated in an upward or downward direction until the separator members 620 are aligned with the interface between the two substrates. The separator units 630 are moved inward until the threshold pressure is sensed. If sensed pressure equals or exceeds the threshold pressure, the inward movement of the separator units 630 is halted. As the substrates begin to separate and the pressure drops below the threshold, the separator members 620 are again urged inward until the pressure reaches the threshold pressure. If the substrate support 610 impedes the inward progress of the separator units 630, the substrate support 610 can be lowered. The process continues until the substrates are completely separated from one another.

The separator can sense that the two substrates are separated when continued inward movement of the separator units 630 does not produce an increase in sensed pressure. In some implementations, the separator units 630 are prevented from moving inward beyond a predetermined location. In one implementation, the substrates 200, 240 do not contact the substrate support 610 during separation. When the lower substrate 200 separates from the upper substrate 240 and falls onto the substrate support 610, a detector can sense that the substrates 200, 240 are completely separated. In one implementation, the substrate support 610 includes a vacuum chuck and pressure sensor to sense whether the substrate 200 is contacting the substrate support 610. In this implementation, the substrate support 610 can have an aperture that is sealed when the substrate 200 covers the aperture. A change in pressure can indicate that a substrate is covering the aperture. Alternatively, a device, such as a lever, or a camera, can detect the separation of the substrates. In one implementation, the separator units can be limited from moving inward beyond a predetermined point.

As the substrates 200, 240 are separated, the process can be monitored using an infrared camera. The infrared camera can reveal the edge of the bonded area of the substrates 200, 240. If the separation is not occurring at a constant rate at each separator unit, the rate of one or more of the separator units 630 can be adjusted.

The silicon substrate 200 can be cleaned and the back side oxide 203 can be stripped. The silicon substrate 200 can again be cleaned.

Referring to FIG. 13, a back side sacrificial substrate 241 can be bonded to the back side 215 of the silicon substrate 200 (step 830, FIG. 34). The front side 210 of the substrate 200 is exposed to permit bonding and formation of the nozzle silicon layer 132.

Referring to FIG. 14, the nozzle layer can be prepared in a silicon-on-insulator (SOI) substrate 300 (step 835, FIG. 34). The insulator layer 302 can be an oxide or a nitride. Alternatively, the nozzle can be formed in a 100 plane DSP wafer. The nozzle layer 132 can be thinned to the desired thickness. One or more grinding and/or etching steps, such as a bulk grinding step, can be used to achieve the desired nozzle layer thickness. In one implementation, the nozzle layer 132 is ground as much as possible to achieve the desired thickness, because grinding can control thickness precisely. The thickness can be between around 1 and 100 microns, such as between about 20 and 80 microns, e.g., around 30 to 70 microns. Optionally, a final polish of the exposed surface of the nozzle layer 132 can be used to decrease surface roughness. Surface roughness is a factor in achieving a silicon to silicon bond, as described above. The polishing step can introduce uncertainty in thickness and is typically not used for achieving the desired thickness.

Referring to FIGS. 15 and 16, an oxide layer can be grown on the silicon nozzle layer 132 to form a back side oxide 330. The insulator layer 302 and a handle layer 310 are on the opposite side of the nozzle layer 132 from the back side oxide 330. A photoresist can be formed on the back side oxide 330, such as by spinning-on the resist. The photoresist can be patterned to define the location of the nozzle. The location of the nozzle can be defined by creating an opening in the back side oxide 330.

The nozzle layer 132 is etched using an anisotropic etch, such as a wet etch technique (step 840, FIG. 34). The etch defines a recess 366 in the silicon nozzle layer 132. The recess can have an inverted pyramid shape, or can be in the shape of a hollow pyramidal frustum with a base, a recessed surface 357 parallel to the base and sloped or tapered walls 134. The tapered wall 134 meets the recessed surface 357 at an edge having a length 360. The recess 366 can be etched through to the insulator layer 302. Alternatively, the recess 366 can extend only partially through the nozzle layer 132. If the recess 366 is not etched through to the insulator layer 302, substantially constant recess depths can be achieved by controlling the etch time and rate. A wet etch using potassium hydroxide (KOH) has an etch rate that is dependent on temperature. The recess 366 can be about 1 to about 100 microns deep, such as about 3 to 50 microns. The depth of the recess 366 can at least in part depend on the thickness of the silicon nozzle layer 132.

Referring to FIG. 17, the SOI 300, the silicon substrate 200 and the SOI 400 are bonded together (step 845, FIG. 34). The sacrificial silicon substrate 241 is removed from the silicon substrate 200 (step 850, FIG. 34). The sacrificial silicon substrate 241 can be removed before or after the SOI 300 is bonded to the silicon substrate 200. Prior to bonding, the SOI 300 and the silicon substrate 200 are aligned so that the descender 118 is fluidly connected to the recess 366 with the tapered walls 134.

A silicon-on-insulator substrate 400 (SOI 400) is bonded to the back side of the silicon substrate 200 (step 855, FIG. 34). The SOI 400 includes the membrane silicon layer 142, a buried oxide layer 402 and a handle layer 406. The membrane silicon layer 142 can be thinned, such as by grinding or polishing, prior to the bonding step to achieve the desired thickness. The silicon membrane layer 142 can be between about 1 and 50 microns thick, such as between about 10 and 25 microns thick. Any oxide on the exposed surfaces of the SOI 300, silicon substrate 200 and SOI 400 can be removed, such as with an oxide etch, e.g., BOE. The SOI 400 is brought into contact with the back side of the silicon substrate 200. A fusion bond is achieved. The three substrates are bonded together by annealing to make the fusion bond permanent.

Annealing can be performed at around 1050° C.-1100° C. An advantage of fusion bonding is that no an additional layer is formed between the silicon substrate 200 and the SOI substrates 300 and 400. After fusion bonding, the two silicon layers become one unitary layer such that no to virtually no delineation between the two layers exists when bonding is complete. Therefore, the bonded assembly can be substantially free of an oxide layer inside of the assembly. The assembly can be substantially formed from silicon. Other methods, such as hydrophobic substrate treatment, can be used to prepare the substrates for silicon to silicon bonding.

Referring to FIG. 18, after the fusion bonding, the handle layers 306 and 406 are ground to remove a portion of the thickness (step 860, FIG. 34). Etching can be used to complete the removal of the handle layers 306 and 306. The oxide layers 302 and 402 can also be removed, such as by etching.

Referring to FIG. 19, if the recess 366 does not extend entirely through the nozzle layer, then the front side of the nozzle silicon layer 132 can be etched to complete the nozzle. A photoresist can be applied to the front side of the nozzle silicon layer 132 and patterned to define the location of the nozzle opening 120. The opening can be circular or rectangular. Other opening geometries can also be suitable, such as a polygon with five or more sides. The nozzle silicon layer 132 is etched in a location corresponding to the recess 366 so that the nozzle has a tapered entry leading to a substantially straight walled outlet (step 865, FIG. 34). The nozzle silicon layer 132 can be DRIE etched to form the nozzle opening 120. The nozzle opening 120 can be about 5 to 40 microns in diameter, such as about 25 microns in diameter. Streets (described further below) can be etched at this time into the nozzle silicon layer 132 (step 870, FIG. 34). The diameter 377 of the nozzle opening 120 can be sufficiently large to intersect the tapered walls 134 of the recess 366. The nozzle recess 366 forms the nozzle entry.

Referring to FIG. 20, in one implementation, a side cross sectional view of the nozzle layer shows the tapered walls 134 intersecting with perpendicular walls of the nozzle opening 120. The diameter of the nozzle opening 120 is large enough so that the tapered walls 134 do not extend all the way to the front side surface of the nozzle silicon layer 132.

The silicon substrate 200 is now a module body 124. Any photoresist can be stripped, completing the module body 124. The module body 124 can then be baked, such as at about 1100° C. for about 4 hours, to remove any polymer or organics.

Actuator Manufacture

Referring to FIGS. 21 and 35, a piezoelectric layer 500 is provided, which is a block of pre-fired piezoelectric material (step 905). The piezoelectric material can be a lead zirconate titanate (PZT), although other piezoelectric materials can be used. In one implementation, the PZT has a density of about 7.5 g/cm$^3$ or more, e.g., about 8 g/cm$^3$. The d31 coefficient can be about 200 or greater. HIPS-treated piezoelectric material is available as H5C and H5D from Sumitomo Piezoelectric Materials, Japan. The H5C material exhibits an apparent density of about 8.05 g/cm$^3$ and d31 of about 210. The H5D material exhibits an apparent density of about 8.15 g/cm$^3$ and a d31 of about 300. Substrates are typically about 1 cm thick and can be sawn to the desired working thickness. The piezoelectric material can be formed by techniques including pressing, doctor blading, green sheet, sol gel or deposition. Piezoelectric material manufacture is discussed in Piezoelectric Ceramics, B. Jaffe, Academic Press Limited, 1971, the entire contents of which are incorporated herein by reference. Forming methods, including hot pressing, are described at pages 258-9. Single crystal piezoelectric material such as lead-magnesium-niobate (PMN), available from TRS Ceramics, Philadelphia, Pa., can also be used. Bulk PZT materials can have higher d coefficients, dielectric constants, coupling coefficients, stiffness and density than sputtered, screen printed or sol-gel formed PZT materials.

These properties can be established in a piezoelectric material by using techniques that involve firing the material prior to attachment to a body. For example, piezoelectric material that is molded and fired by itself (as opposed to on a support) has the advantage that high pressure can be used to pack the material into a mold (heated or not). In addition, fewer additives, such as flow agents and binders, are typically required. Higher temperatures, 1200-1300° C. for example, can be used in the firing process, allowing better maturing and grain growth. Unlike piezoelectric layers that are formed by sol gel or sputtering techniques, the grains in a bulk piezoelectric material can have a width of between about two and four microns. Firing atmospheres (e.g., lead enriched atmospheres) can be used to reduce the loss of PbO (due to the high temperatures) from the ceramic. The outside surface of the molded part that may have PbO loss or other degradation can be cut off and discarded. The material can also be processed by hot isostatic pressing (HIPs), during which the ceramic is subject to high pressures. The Hipping process can be conducted during firing or after a block of piezoelectric material has been fired, and is used to increase density, reduce voids and increase piezoelectric constants. The Hipping process can be conducted in an oxygen or oxygen/argon atmosphere.

The starting layer of piezoelectric material can be between about 100 and about 400 microns, such as between around 250 and about 300 microns, thick. The piezoelectric material has a bottom surface 504 and a top surface, where the bottom surface 504 will eventually be the surface that is closest the module body 124.

The piezoelectric layer 500 is bonded to a handle layer 502 (step 910, FIG. 35). The handle layer 502 can be formed of the same material that is used to form the body 200. The handle layer 502 can include silicon. The handle layer 502 provides a layer for holding and transporting the piezoelectric layer 500 so that the piezoelectric layer 500 is not damaged during processing. The handle layer 502 will also control the expansion of the piezoelectric layer 500 during a subsequent heating and bonding step, as described further below. The handle layer 502 can be between 400 to 1000 microns thick, although the exact thickness is relatively unimportant. In one implementation, the handle layer 502 is wider than the piezoelectric layer 500. The bonding layer between the handle layer 502 and the piezoelectric layer 500 can include a layer of polymerized benzocyclobutene (BCB). The adhesive can be cured, such as by heating the assembly.

Referring to FIG. 22, the piezoelectric layer 500 can then be thinned to a desired thickness so that the layer is thicker than the final desired thickness of the piezoelectric portion of the actuator (item 140 in FIG. 1), but thinner than the block of pre-fired piezoelectric material (step 915, FIG. 35). In one implementation, the piezoelectric layer 500 is thinned to less than about 200 microns, or about 50 microns.

To thin the piezoelectric layer 500, a precision grinding technique, such as horizontal grinding, can be used to produce a highly uniform thin layer having a smooth, low void surface morphology. In horizontal grinding, a workpiece is mounted on a rotating chuck having a reference surface machined to a high flatness tolerance. The exposed surface of the workpiece is contacted with a horizontal grinding wheel, also in alignment at high tolerance. The grinding can produce flatness and parallelism of, e.g., about 0.25 microns or less, e.g., about 0.1 microns or less, and a surface finish to 5 nm Ra or less over a substrate. The grinding also produces a uniform residual stress.

A suitable precision grinding apparatus is Toshiba Model UHG-130C, available through Cieba Technologies, Chandler, Ariz. The substrate can be ground with a rough wheel followed by a fine wheel. A suitable rough and fine wheel have 1500 grit and 2000 grit synthetic diamond resinoid matrices, respectively. Suitable grinding wheels are available from Adoma or Ashai Diamond Industrial Corp. of Japan.

One implementation of the grinding process uses the following parameters. The workpiece spindle is operated at 500 rpm and the grinding wheel spindle is operated at 1500 rpm. The x-axis feed rate is 10 microns/min for first 50-300 microns using the rough wheel and 1 micron/min for last 50-100 microns using the fine wheel. The coolant is 18 megohms-cm deionized water.

After grinding, the piezoelectric layer 500 essentially has a flat surface with both securely attached grains and loose grains of piezoelectric material, as well as a paste made up of particles of piezoelectric material and grinding fluid. The grinding process cleaves many of the grains of piezoelectric material, but also loosens some of the grains. Following the grinding, the piezoelectric material can be cleaned in a 1% solution of fluoroboric acid ($HBF_4$) to remove surface damage caused by the grinding (step 920, FIG. 35). The grains of piezoelectric material that were loosened by the grinding process are substantially removed, leaving small recesses, while the securely attached grains remain. The cleaning can also remove any additional materials that are may be left on the piezoelectric material surface, such as the paste. The surface morphology can be measured with a Zygo model Newview 5000 interferometer with Metroview software, available from Zygo Corp, Middlefield, Conn.

Referring to FIG. 23, the piezoelectric layer 500 is diced or cut (step 925, FIG. 35). First, the front side 510 of the piezoelectric layer 500 can be cut using a diamond wheel to define ground cuts 544. The cuts 544 can have a depth greater than fifteen microns, such as between about fifteen and fifty microns in depth. The ground cuts 544 can have a cross-section that is vertical for most of the depth of the cut but rounded at the base of the cut. To simplify manufacture, the ground cuts 544 can extend the entire width of the piezoelectric layer 500.

A conductive layer is then formed on the front side of the piezoelectric layer 500, such as by metalizing, for example, by vacuum depositing, e.g., sputtering (step 930, FIG. 35). Conductors for deposit can include copper, gold, tungsten, tin, indium-tin-oxide (ITO), titanium, platinum, a combination of metals, or other materials that would be desirable for use as an electrode. In one implementation, the conductive layer includes stacked layers of titanium-tungsten, gold-tin and gold. The conductive layer 505 will form the bottom electrode 152 and, in one implementation, a part of a wrap-around connection 150.

Referring to FIG. 24, a top view, the piezoelectric layer can be sectioned to produce multiple actuator portions, with each actuator portion corresponding to a separate pumping chamber (step 935, FIG. 35). The sectioning, or wells cuts 503 separate the piezoelectric material of one piezoelectric actuator from the piezoelectric material of a neighboring piezoelectric actuator, which can reduce and in some cases eliminate cross-talk between neighboring actuators. The wells cuts are made to be deeper than the final thickness of the piezoelectric layer 140. In one implementation, the cuts are not as deep as the total thickness of the piezoelectric layer 500 in which the cuts are made. In one implementation, the well cuts are at least fifteen microns deep. If the ground cuts 544 lie along the X-axis of the piezoelectric layer 107, the wells cuts 503 can be made along the Y-axis of the piezoelectric layer 500 such that the ground cuts 544 are perpendicular to the wells cuts 503. The wells cuts 503 are made after the step of forming a conductive layer so that the cuts that do not have conductive material along their vertical walls, unlike the ground cuts 544.

One of the cuts removes piezoelectric material from the isolation area 148 above the descender region 118. The isolation area 148 cuts are made parallel to the ground cuts 544. Channel cuts 503 that separate individual flow paths are formed substantially perpendicular to the ground cuts 544.

Referring to FIG. 25, alignment cuts 571 can be formed in the bottom surface 504 of the piezoelectric layer 500 (step 945, FIG. 35). The alignment cuts 571 can be used in a subsequent aligning step, as described further below. The alignment cuts 571 extend entirely through the piezoelectric layer 500 and can extend partially into the handle layer 502. In one implementation, the alignment cuts 571 are around 80 microns in depth. The alignment cuts 571 can be made either along the X-axis of the piezoelectric layer 500, i.e., parallel to the ground cuts, or along the Y-axis. The alignment cuts 571 are made in a peripheral portion of the piezoelectric layer 500, such as outside of the area of the piezoelectric layer 500 that corresponds to a printhead die location, such as between the printhead die location and the edge of the piezoelectric layer 500, described further below. The alignment cuts 571 do not overlap the portion of the piezoelectric layer 500 that subsequently will form the individual actuators. If the handle layer 502 is wider than the piezoelectric layer 500, the alignment cuts 571 can be made in the handle layer 502 in a region that is outside if the piezoelectric layer 500.

As shown in FIG. 26, alignment slots 582 are made into the piezoelectric layer 500 (step 950, FIG. 35). Plunging a saw into the top surface of the handle layer 502 can make the alignment slots 582. This forms a semicircular profiled cut. To reduce the risk of breaking or weakening the assembly (the piezoelectric layer 500 and handle layer 502), the alignment slots 582 are made orthogonal to the alignment cuts 571 and only a couple of alignment slots are made. The alignment slots 582 need only be deep enough to intersect the alignment cuts 571.

As shown in FIG. 27, a top view through the handle layer 502 reveals that the intersection of the cuts 571 and the slots 582 for through holes 585. The throughholes 585 can be used to align the piezoelectric layer 500 with the module body 124.

Referring to FIG. 28, a layer of bonding material, such as, BCB 512, is spun onto either the piezoelectric layer 500 or the module body 124 (step 955, FIG. 35).

Referring to FIG. 29, the piezoelectric layer 500 and the module body 124 are aligned and brought together so that the isolation cut 148 is over the descender 118 and the ground cut 544 is between the ascender 108 and an edge of the die. The chambers 116 in the module body 124 are spaced such that when the piezoelectric layer 500 is brought together with the module body 124, the chambers 116 are aligned with the conductive layer 504 that is between each of the well cuts 503. The chambers 116 can be narrower, as wide as or wider than the piezoelectric layer 500 between each well cut 503. The module body 124 can have a nozzle plate cover substrate 530 bonded onto the nozzle silicon layer 132 prior to the alignment to keep debris from entering the nozzle opening 120. The piezoelectric layer 500 and module body 124 are bonded together (step 960; FIG. 35).

Referring to FIG. 30, the nozzle plate cover substrate 530 is removed. In one implementation, the assembly is placed in a quartz oven at 200° C. for 40 hours to polymerize the BCB. A tape 535, such as a UV tape, can be applied to the nozzles. The silicon handle layer 502 and part of the piezoelectric layer 500 are removed by grinding (step 965, FIG. 35). The tape 535 can be removed and a thin tape can be applied. The piezoelectric layer 500 is ground again and cleaned in fluoroboric acid (step 970, FIG. 35). The piezoelectric layer 500 is sufficiently thinned so that all of the cuts made in the piezoelectric layer 500 (the well cuts 503 and ground cuts 544) are exposed. The piezoelectric layer 500 can be less than twenty microns, such as, about fifteen microns, when processing is complete.

Referring to FIG. 31, an upper conductive layer is disposed on the piezoelectric layer 140, such as, by sputtering a conductive material (step 970, FIG. 35). The conductive material can be a material such as those described above with respect to the first conductive layer. The upper conductive layer can then photolithographically etched to form electrode break 160 and to remove metal from the membrane 142 above the descender 118. Alternatively, a mask or lift off technique can be used to pattern the upper conductive layer. One portion of the upper conductive layer connects to the first conductive layer 505 by way of the conductor on the side walls of the piezoelectric layer 500 in the ground connect gap 144, thereby forming the wrap-around connection 150.

Referring to FIG. 32, a top view, the upper electrode 156 can be narrower than the piezoelectric layer 140 of each actuator. The upper electrodes can be the same width or narrower than the piezoelectric islands upon which they are located. The upper electrodes can include a contact pad 162 that is connected to the main area of the electrode by a thinner connector 170. In one embodiment, the upper electrode is narrower than the pumping chamber. The ratio between the width of the upper electrode and the pumping chamber can be about 0.5 to about 1.2, such as about 0.65 to about 0.9. Additionally, the piezoelectric islands can be the same width, wider or narrower than the chambers over which they are positioned. If the piezoelectric islands are wider than the pumping chamber, such as between about 10 and 20 microns wider, the walls between the pumping chambers can support the piezoelectric islands. Forming the piezoelectric islands wider than the chambers allows for a greater pressure to be applied to the MEMS body and piezoelectric layer assembly during bonding while reducing the risk of the piezoelectric portion punching through the membrane when the pressure is applied. If the lower electrodes are ground electrodes, the ground electrodes of each piezoelectric actuator can either be connected together or each structure's ground can be isolated.

The piezoelectric layer 140 of each actuator is completely separated from neighboring actuators. The silicon membrane layer 142 has no cuts made between the actuators.

Referring to FIGS. 33A and 33B, cuts can be made into the assembly for separating dies from the assembly (the module substrate 124 and the actuator 122). Cuts can be made into a perimeter of the back side of the piezoelectric layer 500 to mine for the fiducials on the base silicon layer 136. Once the fiducials are located, the fiducials can be used to align the substrate with the saw and dicing cuts 562 can be made into the module body 124 that align with the streets 561 in the base silicon layer (step 980, FIG. 35). The dicing cuts surround each die.

Figure 33D:
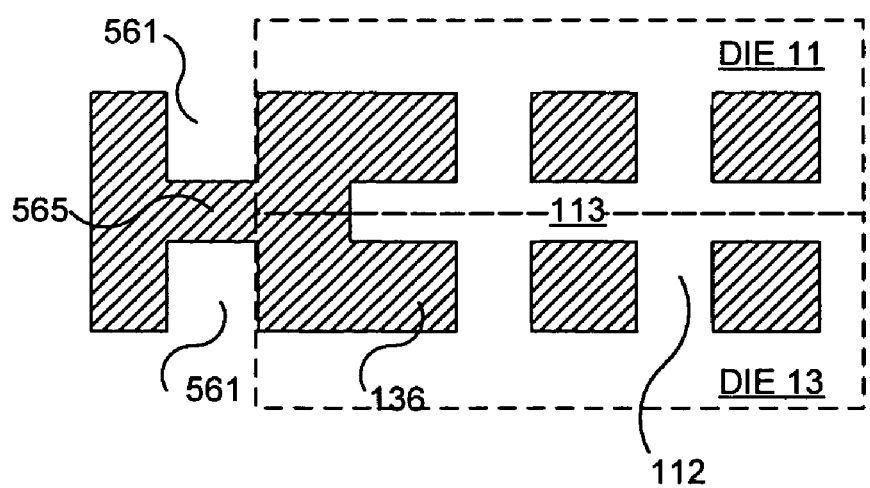

Referring to FIG. 33C, the dicing cuts 562 can be made so that they do not intersect the streets 561 formed in the front side of the substrate. The streets 561 can define the boundary of each die. The streets 561 can be located outside of the area in which the features are located. Referring to FIG. 33D, a cross sectional view of the assembly showing two adjacent dies, the streets 561 do not intersect one another. Rather, the streets 561 are formed as non-intersecting segments, and a dam or tab of silicon 565 is left where the intersection would typically occur. Thus, if a breach occurs in one die, such as, during processing or testing, only the neighboring die (on the opposite side of the fill channel 113) is affected rather than all the dies on the substrate being affected. Streets 561 and dicing cuts 562 are formed that align with the fill channels 113. The dies can be separated from one another by manually breaking the assembly along the streets 561 (step 985, FIG. 35).

Referring to FIGS. 36A, 36B, 36C, 37 and 38, each die can have one or more droplet ejectors. For dies having few droplet ejectors, such as one, two or ten, the droplet ejectors can be disposed in a single column of parallel ink flow paths and actuators. If many droplet ejectors are to be formed on a single die, the droplet ejectors can be disposed in two parallel columns with nozzles associated with alternating columns. The nozzles can be located in a line, or alternatively, the nozzles can be slightly offset from one another.

The modules can be used in printers for offset printing replacement. The modules can be used to selectively deposit glossy clear coats to printed material or printing substrates. The printheads and modules can be used to dispense or deposit various fluids, including non-image forming fluids. For example, three-dimensional model pastes can be selectively deposited to build models. Biological samples may be deposited on an analysis array.

As will be obvious from the description, any of the described techniques can be combined with other techniques to achieve the goals of the specification. For example, any of the above techniques can be combined with the techniques and apparatus described in Printhead patent application Ser. No. 10/189,947, application date Jul. 3, 2002, the entire contents of which are incorporated herein by reference. In one embodiment, the piezoelectric actuator is fixed to the module substrate before the nozzle layer is bonded to the module substrate. Because the above method can reproducibly form a highly uniform membrane layer that is less than 15 microns, this method can be used in microelectromechanical devices other than printing apparatuses. For example, a highly uniform thin membrane can be used with a transducer. Still further embodiments are in the following claims.

Difficulties posed by conventional methods of forming piezoelectric actuators can be overcome with the methods described herein. Piezoelectric layers that are formed from pre-fired sheets of piezoelectric material can allow for treating the piezoelectric material with techniques that the body may not be able to withstand without damage to the body. For example, if the piezoelectric actuator is formed separately from the body, the piezoelectric material can be fired to a temperature that creates better maturing and grain growth. The same high temperatures may not be tolerated by the other components of the MEMS. Additionally, bulk piezoelectric materials can have higher d coefficients, dielectric constants, coupling coefficients, stiffness and density than sputtered or sol-gel piezoelectric materials. Piezoelectric materials formed by other methods, such as by sol-gel application to the body, can require that there be additives in the piezoelectric pre-cursor. The additives are often burned off, creating a less dense piezoelectric material than can be formed when the bulk piezoelectric material is formed separately from the body. Forming a bulk piezoelectric material separately from the body allows the material to include fewer or no additives. Additionally, the bulk material can be fired under pressure. Higher temperatures and pressures make the material denser, which generally improves the material properties, and in particular, reduces the number of voids in the material. Voids can create electrical shorts and ruin the device.

However, processing pre-fired sheets of piezoelectric material to form piezoelectric actuators can lead to risks. For example, if the piezoelectric layer is cut to separate individual actuators after bonding the piezoelectric material to the body, there is a risk of cutting into the chamber body, which can potentially cause leaks. Conversely, there is a risk of not cutting deeply enough into the piezoelectric material, leaving tabs between neighboring structures. If the cuts are not uniform, the structures may each have varying degrees of piezoelectric response to the same power input, and cross-talk can occur between structures. Cut depth non-uniformity can occur because of saw blades that become worn with use or variation in saw positioning with respect to the piezoelectric layer.

Forming the piezoelectric actuators by grinding and dicing the piezoelectric material prior to bonding the material onto the chamber body can create uniformly thick piezoelectric actuators. The piezoelectric portion can be uniformly thick across a single actuator. The actuators can also have a very uniform thickness across a group of actuators. As an example of the dimensional uniformity that can be achieved across structures in a die, each structure can have a piezoelectric actuator that is between about 25 and 200 microns, or approximately 150 microns wide, the die having between 100 and 200 structures in a row, and the difference in thicknesses across the piezoelectric actuators of a die can be as little as two microns. Cutting individual islands followed by grinding down the piezoelectric material can form islands with top and bottom surfaces that are parallel to one another. This geometry may not be achieved with a screen printing method or by depositing green sheets of ceramic material, patterning the ceramic material and firing the ceramic materials. Methods such as firing green sheets, screen printing and sol-gel application, can form piezoelectric actuators that do not have a rectangular cross section. For example, these methods can form actuators with a planar bottom and a curved top or a cross-section that appears to have the upper corners of the rectangle removed. By cutting the islands from a bulk piezoelectric material, the thickness of the actuator across the width and length of the actuator can be very uniform. Piezoelectric actuators with high uniformity of dimensions can exhibit very uniform piezoelectric characteristics.

Forming the cuts prior to bonding the piezoelectric material can allow for the wrap-around electrode structure to be formed. The wrap-around electrode structure creates a contact area for the bottom electrode that is on the top of the piezoelectric layer. The wrap-around electrode structure can simplify connecting an integrated circuit to the actuators.

Forming the actuators to be narrower than the width of the pumping chamber can concentrate the displacement of the actuator over the most flexible portion of the membrane. By making the actuators narrower, less voltage is required to actuate the piezoelectric material. The top electrode can be made narrower than the piezoelectric layer to concentrate the voltage at the central portion of the piezoelectric layer. This can reduce competing piezoelectric forces across the piezoelectric layer. Forming the upper electrode to be narrower than the piezoelectric layer causes the actuator to respond better to input voltage. Better actuator response allows for a lower drive voltage to be applied across the actuator to achieve the desired actuator response. The advantage of forming the actuators to be wider than the pumping chamber is that the walls surrounding the pumping chambers can support the actuators. If the walls support the pumping chambers, the risk of the actuators breaking through the membrane is reduced. In particular, if pressure is applied to the actuators, such as during a bonding process, the likelihood of damaging the device is reduced.

Thinning a relatively thick piezoelectric layer after bonding the layer to a handle layer can facilitate processing steps for forming the actuator. If the piezoelectric layer is not thinned to a suitable working thickness prior to bonding onto the chamber body, a longer thinning process may be required after bonding. Also, it is desirable that the handle material is stiffer than the piezoelectric layer. A stiffer handle layer allows the assembly to expand close to the thermal expansion of the handle material when the assembly is heated. However, thinning the piezoelectric layer to its final thickness before attaching to the handle layer may not enable the desired thickness to be achieved without damaging the piezoelectric layer. The handle layer provides a base for securing the piezoelectric material during thinning. If the apparatus for thinning the piezoelectric material can secure the handle layer rather than securing the piezoelectric layer during thinning, there is less likelihood that the securing feature will interfere with the thinning process. In one implementation, the handle is clamped to the thinning apparatus and a grinding wheel grinds the piezoelectric layer to the desired thickness. Because the clamp only needs to contact the handle layer, the clamp need not interfere with the grinding wheel.

Grinding can cause some of the exposed grains to be loosened from the piezoelectric material. Additionally, the grinding forms a paste-like substance, the paste-like substance including broken bits of piezoelectric material. The paste-like substance can be deposited on the piezoelectric layer during grinding. The paste-like substance and the loosened grains can create gaps in the bonding between the piezoelectric layer and the conductive layer. The degree of these gaps can vary from spot-to-spot and cause variations in performance.

Cleaning the piezoelectric material after grinding removes the loosened grains of piezoelectric material and paste and causes the surface of the piezoelectric material to consist mainly of fully secured grains of piezoelectric material. The cleaning creates a rougher surface, but improves the efficiency and uniformity of the piezoelectric characteristics of the piezoelectric material over piezoelectric material that has a flat surface with loosened piezoelectric grains of material. Cleaning the piezoelectric material after grinding also improves the surface for applying a conductive material. If the surface is free of paste and loosened grains of material, the likelihood of gaps existing between the conductive material and the cohesive block of piezoelectric material is reduced.

The thermal expansion of piezoelectric material can be controlled by bonding the piezoelectric material to a handle layer prior to bonding the piezoelectric material to the body. When the piezoelectric material and the chamber body are heated to form the bond between the two structures, the piezoelectric material (or other suitable piezoelectric material) and the material used to form the body can expand at different rates, particularly if the body is made from a material other than piezoelectric material, such as silicon. Moreover, the expansion and contraction of piezoelectric material due to thermal change can be variable. That is, piezoelectric material that is heated up and cooled back to its original temperature may not immediately return to its originally size. The rate of thermal expansion and contraction can vary due to different factors, such as how long ago the material was poled and how many thermal cycles the material has already experienced. The changes in the size of the chamber body and piezoelectric material caused by heating can change the alignment of the chamber walls with respect to the separation cuts.

If the handle layer is made up of the same material as body, the handle material can control the expansion rate of the piezoelectric material such that the expansion rates of the piezoelectric material and the body are substantially the same. Particularly when the handle layer is much thicker than the piezoelectric material, the handle layer can force the piezoelectric material to expand and contract with the handle layer. In one implementation, the piezoelectric material is PZT and the handle layer is silicon that has a thickness that is ten times that of the PZT layer. Silicon is approximately three times stiffer than PZT. Between the difference in thickness and stiffness, silicon appears to have a spring rate that is thirty times that of the PZT. The material with the greater apparent spring rate overrides the expansion and contraction of the other material thereby causing the PZT to expand at the same rate as the silicon.

Modifications can be made to the above mentioned processes to achieve the nozzle formation. In one implementation, all of the etching is performed from the back side of the nozzle layer. In another implementation, the insulator layer is not removed from the nozzle. To complete the nozzle, the insulator layer can be etched so that the walls of the opening are substantially the same as the walls of the nozzle outlet. Alternatively, the walls of the opening in the insulator layer can be different from the walls of the nozzle outlet. For example, the nozzle entrance can have tapered walls that lead into a straight parallel walled portion formed in the insulator layer. Forming the opening in the insulator layer can either occur before or after attaching the nozzle layer with a flow path module.

One potential disadvantage of forming the nozzles in a separate substrate is that the depth of the nozzles may be limited to a particular range of thicknesses, such as more than about 200 microns. Processing substrates thinner than about 200 microns can lead to a drop in yield, because of the increased likelihood of damaging or breaking the substrate. A substrate generally should be thick enough to facilitate substrate handling during processing. If the nozzles are formed in a layer of an SOI substrate, the layer can be ground to the desired thickness prior to formation while still providing a different thickness for handling. The handle layer also provides a portion that can be grasped during processing without interfering with the processing of the nozzle layer.

Forming the nozzle in a layer of a desired thickness can obviate the step of reducing the nozzle layer after the nozzle layer has been joined with the flow path module. Grinding away the handle layer after the nozzle layer is joined with the flow path module does not leave the flow path features open to grinding solution or waste grinding material. When the insulator layer is removed after the nozzle layer is joined to the flow path module, the insulator layer can be selectively removed so that the underlying silicon layer is not etched.

A nozzle formation process that uses two types of processing can form nozzles with intricate geometries. An anisotropic back side etch can form a recess in the shape of a pyramidal frustum having a base at the surface of the substrate, sloped or tapered walls and a recessed surface in the substrate. A front side etch that is configured so that the diameter is greater than the diameter of the recessed surface of the pyramidal frustum removes the recessed surface of the pyramidal frustum shape from the recess and the nozzle. This technique removes any substantially flat surface that is orthogonal to the direction of ink flow from the nozzle. This can reduce the incident of trapped air in the nozzle. That is, tapered walls that are formed by the anisotropic etch can keep the ink flow resistance low, while accommodating a large amount of meniscus pull-back during fill without air ingestion. The tapered walls of the nozzle smoothly transitions into the straight parallel walls of the nozzle opening, minimizing the tendency of the flow to separate from the walls. The straight parallel walls of the nozzle opening can direct the stream or droplet of ink out of the nozzle.

The depth of the anisotropic etch directly affects the length of both the nozzle entry and the nozzle outlet if the nozzle opening is not formed with a diameter greater than the diameter of the recessed surface of the pyramidal frustum. The anisotropic etch depth is determined by the length of time of the etch along with the temperature at which the etch is performed and can be difficult to control. The geometry of a DRIE etch may be easier to control than the depth of an anisotropic etch. By intersecting the walls of the nozzle outlet with the tapered walls of the nozzle entry, variations in depth of the anisotropic etch do not affect the final nozzle geometry. Therefore, intersecting the walls of the nozzle outlet with the tapered walls of the nozzle entry can lead to higher uniformity within a single print head and across multiple print heads.

Fusion bonding together substrates during the etching process can provide a support for the module substrate during processing. Fusion bonding can provide a stable, yet impermanent bond if the silicon substrates are not annealed. The sacrificial substrate can enable etching without forming an undercut, which can occur at the junction of two different materials that are etched. The sacrificial substrate can keep cooling agents from escaping into the etching chamber. When one portion of the etch is complete, and another is incomplete, the sacrificial substrate prevents overetching from occurring. The sacrificial substrate can also prevent unwanted debris from entering the holes or recesses of an etched substrate during handling.

A mechanical separating device can separate the fusion bonded substrates without requiring a human to perform the tedious process. By including sensors with the device, the proper level of pressure can be applied to the substrates during separation without risking damage to the substrates.

A number of embodiments of the invention have been described. Nevertheless, it will be understood that various modifications may be made without departing from the spirit and scope of the invention. Accordingly, other embodiments are within the scope of the following claims.

What is claimed is:

1. A method of etching a silicon substrate, comprising:
    bonding a first silicon substrate to a sacrificial silicon substrate;
    after bonding, etching the first silicon substrate from an exposed surface of the first silicon substrate through the first silicon substrate and into a flat surface of the sacrificial silicon substrate that is adjacent to the first silicon substrate; and
    applying a pressure at an interface of the first silicon substrate and the sacrificial silicon substrate to cause the first silicon substrate to separate from the sacrificial silicon substrate, wherein applying the pressure at the interface continues until the first silicon substrate is completely separated from the sacrificial substrate.

2. The method of claim 1, wherein bonding the first silicon substrate to the sacrificial silicon substrate creates Van der Waals bonds between the first silicon substrate and the sacrificial silicon substrate.

3. The method of claim 1, wherein etching the first silicon substrate includes a deep reactive ion etch.

4. The method of claim 1, wherein bonding a first silicon substrate to a sacrificial silicon substrate occurs at room temperature.

5. The method of claim 1, wherein etching includes etching into the sacrificial substrate.

6. The method of claim 1, further comprising etching the first silicon substrate before bonding the first silicon substrate to the sacrificial silicon substrate.

7. The method of claim 1, wherein the first silicon substrate and the sacrificial silicon substrate each include opposed flat surfaces and a thin edge and applying a pressure at an interface includes applying pressure parallel to the flat surfaces.

8. The method of claim 7, wherein applying a pressure at the interface includes pressing a sharp edge against the thin edge.

9. The method of claim 1, wherein applying a pressure includes pressing a plurality of sharp edges of a plurality of separating members inwardly.

10. The method of claim 9, wherein pressing the plurality of sharp edges includes pressing with six or eight separating members.

11. The method of claim 9, wherein the plurality of the separating members are spaced at equal angular intervals around the first silicon substrate and the sacrificial silicon substrate.

12. The method of claim 1, wherein applying a pressure at the interface of the first silicon substrate and the sacrificial silicon substrate includes pressing a member having a sharp edge at the interface.

13. The method of claim 12, wherein the member comprises a metal blade having the sharp edge.

14. The method of claim 12, wherein applying a pressure includes sliding the sharp edge between the first silicon substrate and the sacrificial silicon substrate.

15. The method of claim 12, wherein the interface defines a plane and the pressure is applied parallel to the plane.

16. The method of claim 15, wherein applying a pressure includes moving the member having the sharp edge toward a center of the interface.

17. The method of claim 16, further comprising sensing pressure applied by the member.

18. The method of claim 17, further comprising halting motion of the member toward the center of the interface if the sensed pressure exceeds a threshold.

19. The method of claim 16, further comprising preventing the sharp edge from moving beyond a predetermined location.

* * * * *

UNITED STATES PATENT AND TRADEMARK OFFICE
CERTIFICATE OF CORRECTION

PATENT NO.        : 7,622,048 B2                                     Page 1 of 1
APPLICATION NO.   : 11/256669
DATED             : November 24, 2009
INVENTOR(S)       : Birkmeyer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 857 days.

Signed and Sealed this

Fourteenth Day of December, 2010

David J. Kappos
*Director of the United States Patent and Trademark Office*